US011710789B2

(12) United States Patent
Li et al.

(10) Patent No.: US 11,710,789 B2
(45) Date of Patent: Jul. 25, 2023

(54) THREE DIMENSIONAL (3D) DOUBLE GATE SEMICONDUCTOR

(71) Applicant: QUALCOMM Incorporated, San Diego, CA (US)

(72) Inventors: Xia Li, San Diego, CA (US); Bin Yang, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 21 days.

(21) Appl. No.: 17/369,532

(22) Filed: Jul. 7, 2021

(65) Prior Publication Data

US 2023/0008615 A1     Jan. 12, 2023

(51) Int. Cl.
| H01L 29/78 | (2006.01) |
| H01L 27/092 | (2006.01) |
| H01L 29/24 | (2006.01) |
| H01L 29/51 | (2006.01) |
| H01L 29/66 | (2006.01) |

(52) U.S. Cl.
CPC ........ H01L 29/7831 (2013.01); H01L 27/092 (2013.01); H01L 29/24 (2013.01); H01L 29/517 (2013.01); H01L 29/66969 (2013.01)

(58) Field of Classification Search
None
See application file for complete search history.

(56) References Cited

U.S. PATENT DOCUMENTS

| 10,038,079 B1* | 7/2018 | Ohtou | H01L 21/823431 |
| 10,205,018 B1* | 2/2019 | Li | H01L 29/78654 |
| 11,521,969 B2* | 12/2022 | Chen | H01L 27/0886 |
| 2008/0258228 A1* | 10/2008 | Chuang | H01L 29/41791 257/E21.632 |
| 2015/0091057 A1* | 4/2015 | Xie | H01L 27/0928 257/190 |
| 2015/0364592 A1 | 12/2015 | Van Dal et al. | |
| 2016/0020210 A1* | 1/2016 | Liaw | H01L 21/30604 257/369 |
| 2016/0211262 A1* | 7/2016 | Jan | H01L 21/823821 |
| 2019/0103496 A1* | 4/2019 | Colinge | H01L 29/7851 |

(Continued)

FOREIGN PATENT DOCUMENTS

EP     3996149 A1     5/2022

OTHER PUBLICATIONS

Choi W., et al., "Recent Development of Two-Dimensional Transition Metal Dichalcogenides and their Applications", Materials Today, vol. 20, No. 3, Apr. 2017, pp. 116-130.

(Continued)

*Primary Examiner* — Vincent Wall

(74) *Attorney, Agent, or Firm* — Qualcomm Incorporated

(57) ABSTRACT

Disclosed are semiconductor devices including a double gate metal oxide semiconductor (MOS) transistor and methods for fabricating the same. The double gate MOS transistor includes a first back gate, a second back gate, and a first dielectric layer disposed on the first back gate and on the second back gate. An MX2 material layer is disposed on the first dielectric layer, a second dielectric layer disposed on the MX2 material layer, and a work function metal (WFM) is disposed on the second dielectric layer. A front gate is disposed on the WFM, which fills a space between the first back gate and the second back.

20 Claims, 16 Drawing Sheets

(56) References Cited

U.S. PATENT DOCUMENTS

2020/0105589 A1* 4/2020 Tsai ............... H01L 29/165
2020/0251473 A1* 8/2020 Li ............... H01L 21/823892
2020/0335635 A1 10/2020 Sharma et al.
2021/0391328 A1* 12/2021 Sio ............... H01L 21/823821

OTHER PUBLICATIONS

Choudhury T.H., et al., "Epitaxial Growth of 2D Layered Transition Metal Dichalcogenides", Materials Science, Sep. 2019, pp. 1-36.
International Search Report and Written Opinion—PCT/US2022/071943—ISA/EPO—dated Aug. 8, 2022.

* cited by examiner

THREE DIMENSIONAL (3D) DOUBLE GATE SEMICONDUCTOR

BACKGROUND OF THE DISCLOSURE

1. Field of the Disclosure

Aspects of this disclosure relate generally to an integrated circuit (IC), and particularly to double gate semiconductor devices, such as a metal oxide semiconductor (MOS), field-effect transistor (FET), MOSFET, FinFET and nanosheet transistors.

2. Description of the Related Art

As technology progresses, manufacturers are looking to find ways to make semiconductors (also known as a chips or integrated circuits (IC)) smaller semiconductors, increase density, increase throughput, or any combination thereof. Gate-All-Around (GAA) semiconductor devices, such as FinFETs and nanosheet FETs have been used as fundamental building blocks for the active portions of many semiconductor devices to the point where millions of transistors may be used in each IC. Accordingly, transistor size and performance impact the overall size and performance of the IC. However, conventional may All-Around (GAA) semiconductor devices may suffer from performance and scaling difficulties as the technology scales to 5 nanometer (nm) and below.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In a first aspect, a double gate metal oxide semiconductor (MOS) transistor includes a first back gate, a second back gate, and a first dielectric layer disposed on the first back gate and on the second back gate. An MX2 material layer is disposed on the first dielectric layer. A second dielectric layer is disposed on the MX2 material layer. A work function metal (WFM) is disposed on the second dielectric layer. A front gate is disposed on the WFM, which fills a space between the first back gate and the second back gate.

In a second aspect, a method of fabricating a double gate metal oxide semiconductor (MOS) transistor includes forming a first back gate, forming a second back gate, depositing a first dielectric layer on the first back gate and on the second back gate, depositing an MX2 material layer on the first dielectric layer, depositing a second dielectric layer on the MX2 material layer, depositing a work function metal (WFM) on the second dielectric layer, and forming a front gate on the WFM. The front gate fills a space between the first back gate and the second back gate.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof. A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "example" and/or "example" are used herein to mean "serving as an example, instance, or illustration." Any aspect described herein as "example" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

As noted above Gate-All-Around (GAA) semiconductor devices, such as FinFETs and nanosheet transistors may suffer from performance and scaling difficulties as the technology scales to 5 nm and below (e.g., 2 nm). The various aspects disclosed include a two-dimensional (2D) MX2 material that can provide for further scaling of channel length than silicon and can enable 2 nm beyond scaling. The 2D MX2 material and 3D double gate integration configurations disclosed provide for 2 nm and beyond scaling and can provide better performance and power efficiency than conventional GAA configurations. In some aspects, the 2D MX2 material device can be built on a silicon wafer or oxide wafer substrate. In further aspects, an optic wave guide can be provided in the substrate for fast long range communication cross the chip with less degradation and fast global communication.

Figure 1:
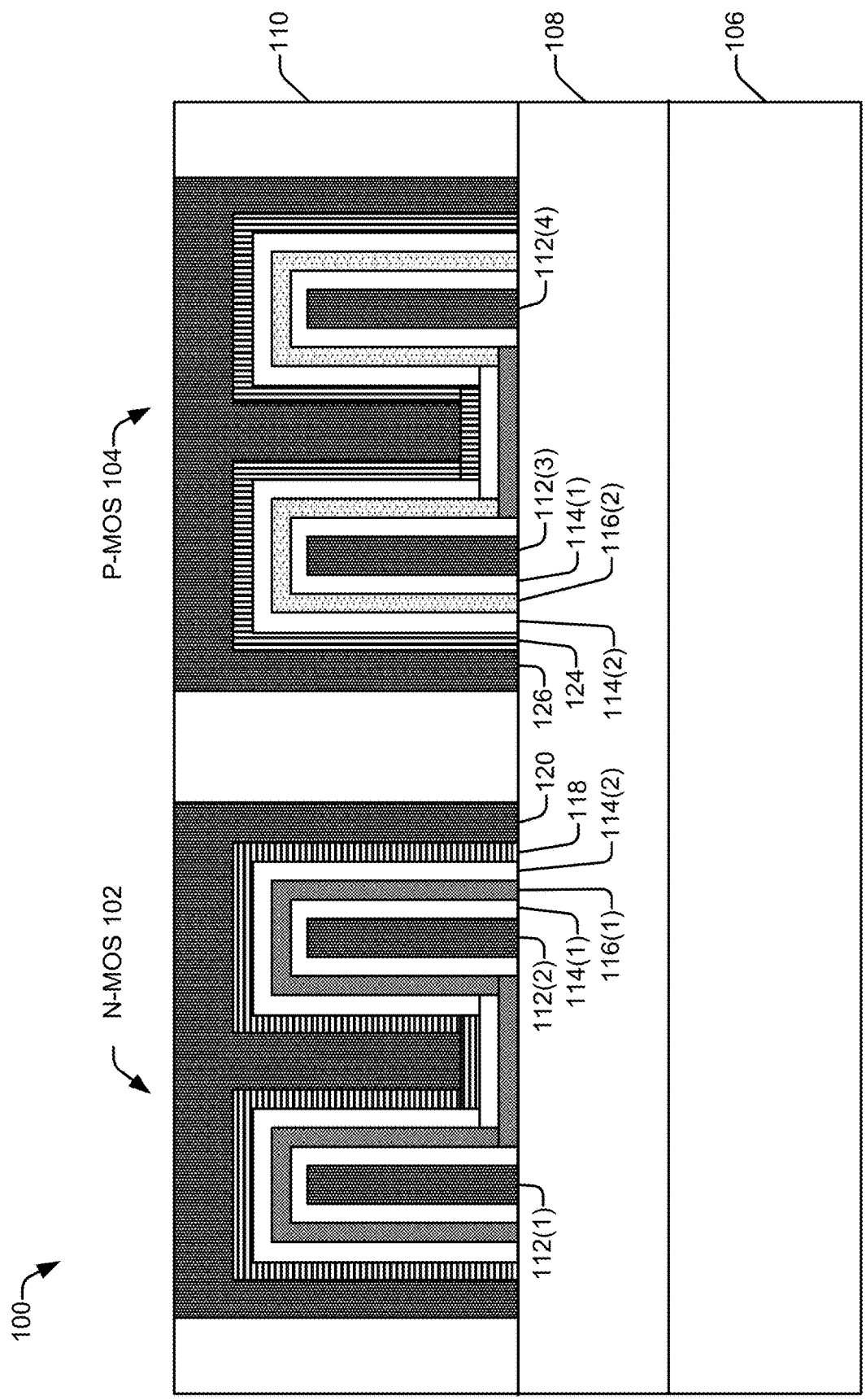
FIG. 1 illustrates a portion of a double gate MOS structure that includes MX2 material, according to various aspects of the disclosure.

FIG. 1 illustrates a block diagram of a portion of a double gate MOS transistor structure 100 that includes MX2 material layer, according to various aspects of the disclosure. The structure 100 includes an N-MOS transistor 102 and a P-MOS transistor 104. In the following description, for convenience, the term "N-MOS" may be used as a shortened version for an N-MOS transistor and the term "P-MOS" may be used as a shortened version for a P-MOS transistor. The structure 100 comprises a double gate with a three-dimensional (3D) fin using two-dimensional (2D) MX2 material transistor integration. Transition metal dichalcogenide (abbreviated as TMD or TMDC) monolayers are atomically thin semiconductors of a type known as MX2 that include a transition metal atom M and a chalcogen atom X. The transition metal atom M may be Molybdenum (Mo), Tungsten (W), Tin (Sn), Hafnium (Hf), Zirconium (Zr), Platinum (Pt), or the like. The chalcogen atom X may be Sulphur (S), Selenium (Se), Tellurium (Te), or the like. In the MX2 material, one or multiple layers of M atoms is sandwiched between two layers of X atoms. The MX2 material is part of a family of materials referred to as "2D materials" to indicate that the materials are relatively thin and mono layers 2D crystal structure.

The structure 100 includes a first inter-metal dielectric (IMD) layer 106 (e.g., bottom dielectric layer), a second IMD layer 108 (e.g., middle dielectric layer), and a third IMD layer 110 (e.g. upper dielectric layer). In some aspects, the first IMD layer 106 and the second IMD layer 108 may comprise a low-k oxide material. In some aspects, the third IMD layer 110 may be different from the first IMD layer 106 and the second IMD layer 108 and may comprise a regular oxide material (i.e., not low-k). The N-MOS 102 includes a first back gate 112(1) and a second back gate 112(2). An oxide layer 114(1) (back gate dielectric) may, in some aspects, include Hafnium Oxide (HfOx), Aluminum oxide ($AlO_3$), or similar dielectric materials. The oxide layer 114(1) is located on the sidewalls and a top of each of the back gates 112(1), 112(2). In the N-MOS 102, the oxide layer 114(1) is located between each of the back gates 112(1), 112(2) and an MX2 layer 116(1). The MX2 layer 116(1) is located on the sidewalls and a top of the oxide layer 114(1). A second oxide layer 114(2) (e.g., front gate dielectric) is located on the sidewalls and a top of the MX2 layer 116(1). The second oxide layer 114(2) may, in some aspects, include HfOx, $AlO_3$, or similar dielectric materials. An N-type work-function metal (N-WFM) layer 118 is located between the oxide layer 114(2) and a front gate 120. The N-WFM layer 118 is located on the sidewalls and on a top of the oxide layer 114(2). The back gates 112(1), 112(2) and the front gate 120 may, in some aspects, include Tungsten (W), Titanium (Ti), Titanium Nitride (TiN), Tantalum (Ta), Tantalum Nitride (TaN), poly silicon, or similar conductive materials.

The P-MOS 104 includes a third back gate 112(3) and a fourth back gate 112(4). The oxide layer 114(1) is located on the sidewalls and a top of each of the back gates 112(3), 112(4). The oxide layer 114(1) is located between the back gates 112(3), 112(4) and an MX2 layer 116(2). The MX2 layer 116(2) is located on the sidewalls and on a top of the oxide layer 114(1). A P-type work-function metal (P-WFM) layer 124 is located between the oxide layer 114(2) and a front gate 126, e.g., on the sidewalls and on a top of the oxide layer 114(2). The back gates 112(3), 112(4), and the front gate 126 may, in some aspects, include Tungsten (W), Titanium (Ti), Titanium Nitride (TiN), Tantalum (Ta), Tantalum Nitride (TaN), poly silicon, or similar conductive materials.

In some aspects, the structure 100 may be formed as follows. The back gates 112 may be formed as fins on the third IMD layer 110. An oxide layer (e.g., HfOx or another type of oxide) may be deposited (e.g., as a back gate dielectric) on top of and as a sidewall to the back gates 112. A 2D MX2 film (e.g., a low temperature growth material) may be used for the MX2 layers 116(1), 116(2) and added on a bottom of the oxide layer 114(1), across the sidewall surfaces, to the top of the oxide layer 114(1). The MX2 layer 116(1) is linked between the two back gates 112 of the N-MOS 102 and the MX2 layer 116(2) is linked between the two back gates 112 of the P-MOS 104. The oxide layer 114(2) (e.g., HfOx or another type of oxide) may be deposited (e.g., as a front gate dielectric). The oxide layer 114(2) is linked between the back gates 112 of the N-MOS 102 and between the back gates 112 of the P-MOS 104. The N-WFM layer 118 may be deposited on the oxide layer 114(2) of the N-MOS 102 and P-WFM layer 124 may be deposited on the oxide layer 114(2) of the P-MOS 104. The N-WFM layer 118 is linked between the back gates 112 of the N-MOS 102 and the P-WFM layer 124 is linked between the back gates 112 of the P-MOS 104. Tungsten (W) may be deposited to form the metal front gates 120, 126. A chemical mechanical polish (CMP) may be performed to complete forming the structure 100.

At least some of the technical advantages of the structure 100 include increasing a cross section area of channels (e.g., the MX2 layers 116(1), 116(2)), which enables increased current flow (as compared to a conventional designs). Additionally, the various aspects disclosed provide for a reduced short channel effect, which facilitates CMOS device channel length to continue to scale below 3 nm.

Figure 2A:
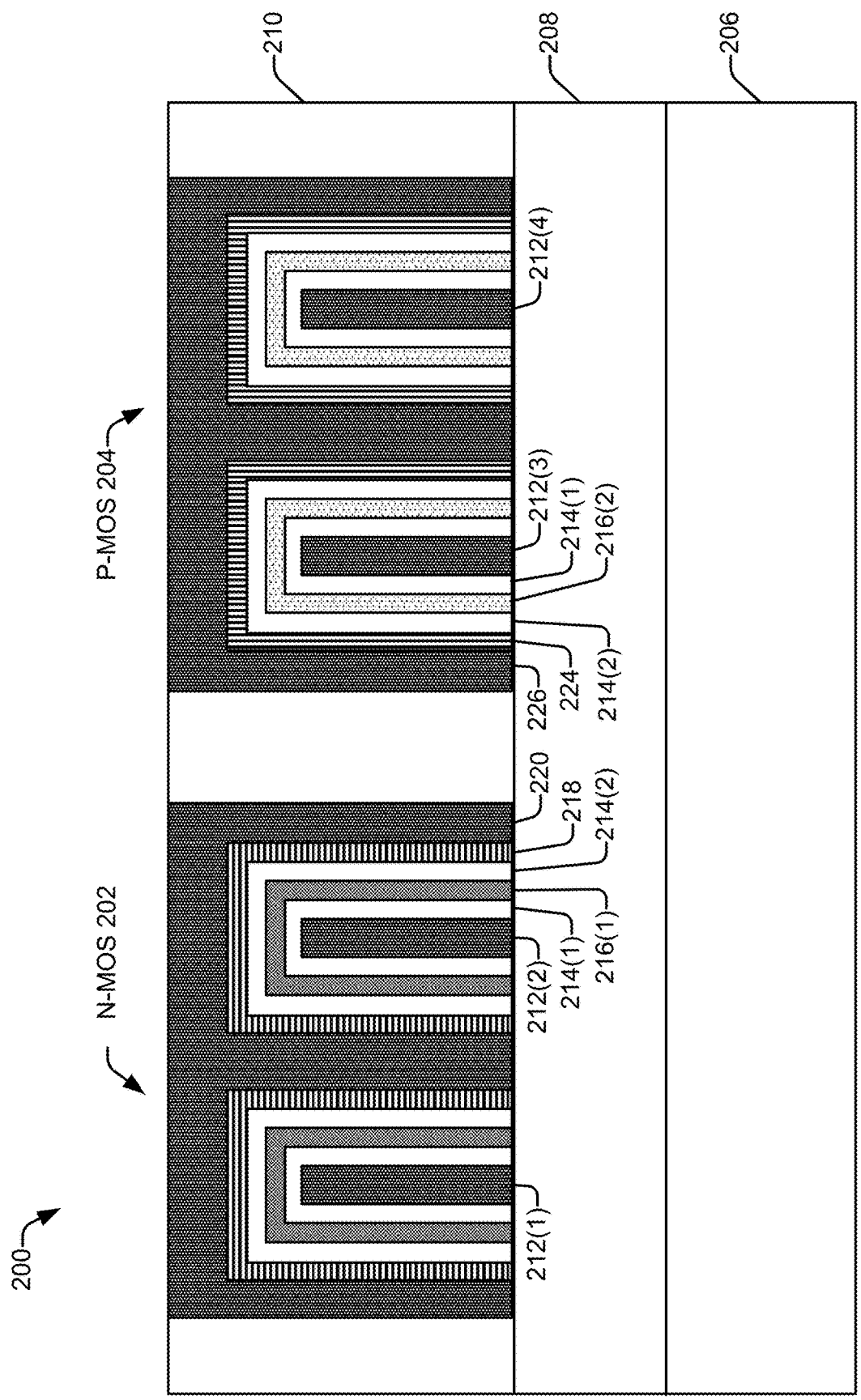
FIG. 2A illustrates a portion of a double gate MOS structure that includes MX2 material, according to various aspects of the disclosure.

FIG. 2A illustrates a block diagram of a double gate MOS transistor structure 200 according to various aspects of the disclosure. The structure 200 includes the N-MOS 202 and the P-MOS 204.

The structure 200 includes a first Inter-Metal Dielectric (IMD) layer 206, a second IMD layer 208, and a third IMD layer 210. The N-MOS 202 includes the back gates 212(1), 212(2). The oxide layer 214(1) (back gate dielectric) may, in some aspects, include Hafnium Oxide (HfOx). The oxide layer 214(1) is located on the sidewalls and a top of each of the back gates 212(1), 212(2). In the N-MOS 202, the oxide layer 214(1) may be located between the back gates 212(1), 212(2) and the MX2 layer 216(1). The MX2 layer 216(1) is located on the sidewalls and a top of the oxide layer 214(1). The second oxide layer 214(2) (e.g., a front gate dielectric) is located on the sidewalls and a top of the MX2 layer 216(1) and may, in some aspects, include HfOx, AlO$_3$, etc. The N-type work-function metal (N-WFM) layer 218 is located between the oxide layer 214(2) and the front gate 220, e.g., on the sidewalls and on a top of the oxide layer 214(2). The back gates 212 and the front gate 220 may, in some aspects, include Tungsten (W), Titanium (Ti), Titanium Nitride (TiN), Tantalum (Ta), Tantalum Nitride (TaN), poly silicon, or similar conductive materials.

The P-MOS 204 includes back gates 212(3), 212(4) and the oxide layer 214(1). The oxide layer 214(1) is located on the sidewalls and a top of each of the back gates 212. The oxide layer 214(1) may be located between the back gates 212(3), 212(4) and the MX2 layer 216(2). The MX2 layer 216(2) is located on the sidewalls and on a top of the oxide layer 214(1). The P-type work-function metal (P-WFM) layer 224 is located between the oxide layer 214(2) and the front gate 226, e.g., on the sidewalls and on a top of the oxide layer 214(2). The back gates 212(3), 212(4) and the front gate 226 may, in some aspects, include Tungsten (W), Titanium (Ti), Titanium Nitride (TiN), Tantalum (Ta), Tantalum Nitride (TaN), poly silicon, or similar conductive materials.

In some aspects, the structure 200 may be formed as follows. The back gates 212 may be formed as conductive fins on the IMD layer x 210. An oxide layer (e.g., HfOx or another type of oxide) may be deposited (e.g., as a back gate dielectric) on top of and as a sidewall to the back gates 212. A 2D MX2 film (e.g., a low temperature growth material) may be used for the MX2 layers 216(1), 216(2) and added across the sidewall surfaces, to the top of the oxide layer 214(1). The oxide layer 214(2) (e.g., HfOx or another type of oxide) may be deposited (e.g., as a front gate dielectric). The N-WFM layer 218 may be deposited on the oxide layer 214(2) of the N-MOS 202 and P-WFM layer 224 may be deposited on the oxide layer 214(2) of the P-MOS 204. Tungsten (W) may be deposited to form the metal front gates 220, 226. A chemical mechanical polish (CMP) may be performed to complete forming the structure 200. In the structure 200, the MX2 layers 216(1), 216(2), the oxide layers 214(2), and the WFM layers 218, 224 are not continuous between the two gates 212 on both the P-MOS 204 and the N-MOS 202. The fabrication differences between structure 100 and 200 include that the CMP is performed to remove the connecting portions. Thus, at the bottom between the two back gates, there is no gate dielectric, MX2 channel film, and work function film.

At least some technical advantages of the structure 200 include the following. The WFM may be tuned for a threshold voltage. In some aspects, the work function metal has different conduct band level in comparison to the MX2 film, and oxide band gap. The delta between the conduct band of work function and the MX2 conduct band or valance band is used to define the threshold voltage of N-MIS and P-MOS. Accordingly, tuning the work function metal conduct band level can be used for Vt tuning. The HfOx provides a high-k material for Tox thickness (thickness of dioxide) scaling for a short channel length. MX2 is 2D channel material that is relatively thin and has a lower dielectric constant. The MX2 enables continual gate length scaling. In addition, the MX2 can be deposited on the IMD oxide layer, not just in silicon, so it expands the usable process area for multiple active area integration, e.g., low-level with silicon transistors, then in IMD with 2D MX transistor to increase active device 3D integration with high density configurations. The double gate configuration provides improved channel control.

Figure 2B:
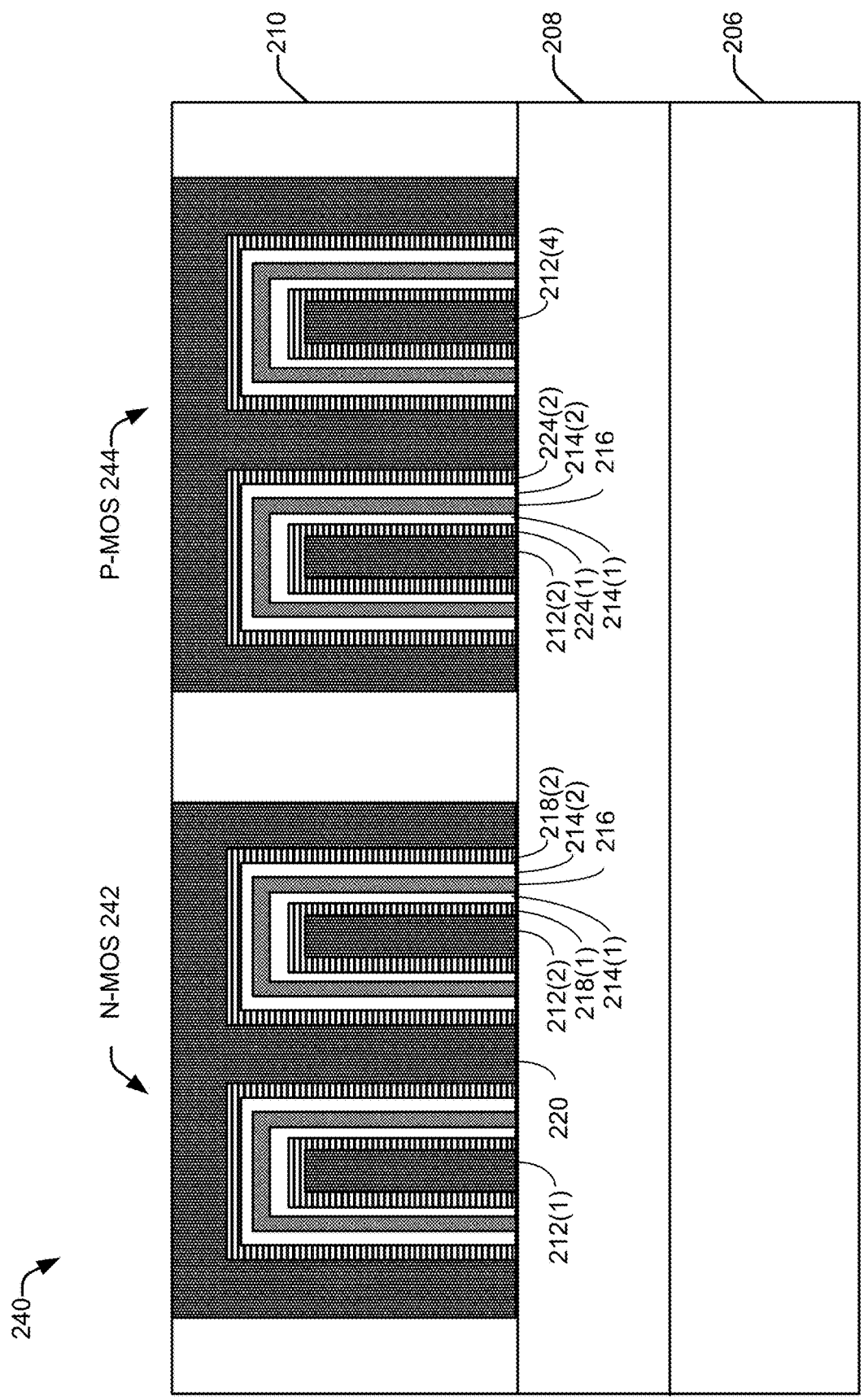
FIG. 2B illustrates a portion of a double gate MOS structure that includes MX2 material, according to various aspects of the disclosure.

FIG. 2B illustrates a block diagram of a double gate MOS transistor structure 240 according to various aspects of the disclosure. The structure 240 includes the N-MOS 242 and the P-MOS 244.

The structure 240 is similar to the structure 200, except that there is an additional work-function metal (WFM) layer disposed on the back gates. The structure 240 includes a first Inter-Metal Dielectric (IMD) layer 206, a second IMD layer 208, and a third IMD layer 210. The N-MOS 242 includes the back gates 212(1), 212(2). Disposed on the back gates 212(1), 212(2) is a first N-type work-function metal (N-WFM) layer 218(1), which may also be referred to as the back gate WFM. In the N-MOS 242, the N-WFM layer 218(1) may be located between the back gates 212(1), 212(2) and a first oxide layer 214(1). The first oxide layer 214(1) (also referred to as the back gate dielectric) may, in some aspects, include HfOx, AlO$_3$, or similar dielectric materials. In the N-MOS 242, the oxide layer 214(1) may be located between the N-WFM layer 218(1) and an MX2 layer 216. The MX2 layer 216 is disposed over (e.g., on the sidewalls and a top) of the oxide layer 214(1). The second oxide layer 214(2) (also referred to as the front gate dielectric) is disposed over the MX2 layer 216 and may, in some aspects, include HfOx, AlO$_3$, or similar dielectric materials. A second N-WFM layer 218(2), which may also be referred to as the front gate WFM and is disposed over the oxide layer 214(2) and is located between the oxide layer 214(2) and the front gate 220. The back gates 212 and the front gate 220 may, in some aspects, include Tungsten (W), Titanium (Ti), Titanium Nitride (TiN), Tantalum (Ta), Tantalum Nitride (TaN), poly silicon, or similar conductive materials.

The P-MOS 244 includes back gates 212(3), 212(4). Disposed on the back gates 212(3), 212(4) is a first P-type work-function metal (P-WFM) layer 224(1), which may also be referred to as the back gate WFM. The first oxide layer 214(1) disposed on the first P-WFM layer 224(1). The first oxide layer 214(1) may be located between the first P-WFM layer 224(1) and the MX2 layer 216. The MX2 layer 216 is disposed on the first oxide layer 214(1). The second P-WFM layer 224(2) is located between the second oxide layer 214(2) and the front gate 226 and is disposed over the second oxide layer 214(2). The back gates 212(3), 212(4) and the front gate 226 may, in some aspects, include Tungsten (W), Titanium (Ti), Titanium Nitride (TiN), Tantalum (Ta), Tantalum Nitride (TaN), poly silicon, or similar conductive materials.

In some aspects, the structure 240 may be formed as follows. The back gates 212 may be formed as conductive fins on the IMD layer 210. The first N-WFM layer 218(1) may be deposed on the back gates 212(1) and 212(2). The first P-WFM layer 224(1) may be deposited on back gates 212(3) and 212(4). An oxide layer (e.g., HfOx or another type of oxide) may be deposited (e.g., as a back gate dielectric) on top of and as a sidewall to the first N-WFM layer 218(1) and first P-WFM layer 224(1) thus also being disposed over the back gates 212. A 2D MX2 film (e.g., a low temperature growth material) may be used for the MX2 layer 216 and deposited across the sidewall surfaces and to the top of the first oxide layer 214(1). The second oxide layer 214(2) (e.g., HfOx or another type of oxide) may be deposited (e.g., as a front gate dielectric). The second N-WFM layer 218(2) may be deposited on the second oxide layer 214(2) of the N-MOS 242 and the second P-WFM layer 224(2) may be deposited on the second oxide layer 214(2) of the P-MOS 244. Tungsten (W) or other suitable conductive material may be deposited to form the metal front gates 220, 226. A chemical mechanical polish (CMP) may be performed to complete forming the structure 240.

In the structure 240, the MX2 layer 216, the second oxide layers 214(2), and the second WFM layers 218(2) and 224(2) are not continuous between the two back gates 212 on both the P-MOS 244 and the N-MOS 242, similar to the structure 200. However, it will be appreciated that various aspects disclosed herein can include the optional back gate WFM layer (e.g., 218(1), 224(1)) disposed on the back gates can be included in the various configurations disclosed herein. For example, in some aspects, structure 100 can be modified to include a back gate WFM layer (e.g., similar to 218(1), 224(1) in structure 240). The structure 100, in some aspects, is modified to include the back gate WFM layers (N-WFM and P-WFM) disposed on the back gates 112 and located between the back gates 112 and the back gate dielectric layer 114 (e.g., 114(1) or 114(2)). Accordingly, it will be appreciated that the various aspects disclosed are not limited to the example configurations expressly illustrated.

Figure 3:
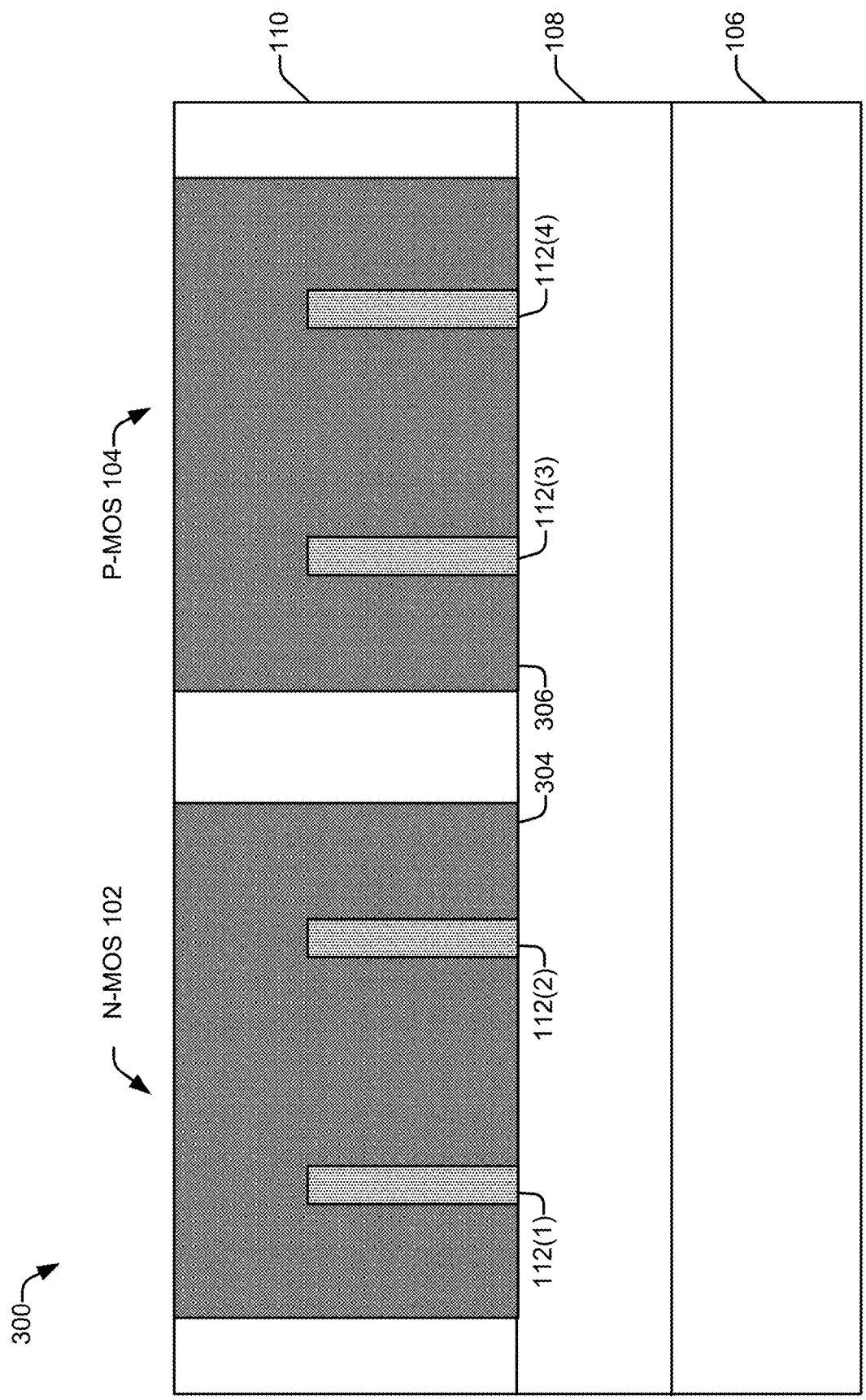
FIG. 3 illustrates a portion of a double gate MOS structure, according to various aspects of the disclosure.

FIG. 3 illustrates a portion 300 of a double gate MOS structure, according to various aspects of the disclosure. FIG. 3 illustrates an x-axis cross-section of the structure 200. As illustrated, back gates 112(1) and 112(2) are coupled to a first back gate contact 304, which in some aspects may be a portion of the front gate (e.g., 220) directly in contact with the back gates 112(1) and 112(2). Back gates 112(3) and 112(4) are coupled to a second back gate contact 306, which in some aspects may be a portion of the front gate (e.g., 226) directly in contact with the back gates 112(3) and 112(4). The back gate contacts 304 and 306 may be formed by depositing a conductive material over the respective back gates 112(1), 112(2), 112(3) and 112(4) and performing a chemical mechanical polish (CMP). The conductive material may include Tungsten (W), Titanium (Ti), Titanium Nitride (TiN), Tantalum (Ta), Tantalum Nitride (TaN), poly silicon, or similar conductive materials.

Figure 4:
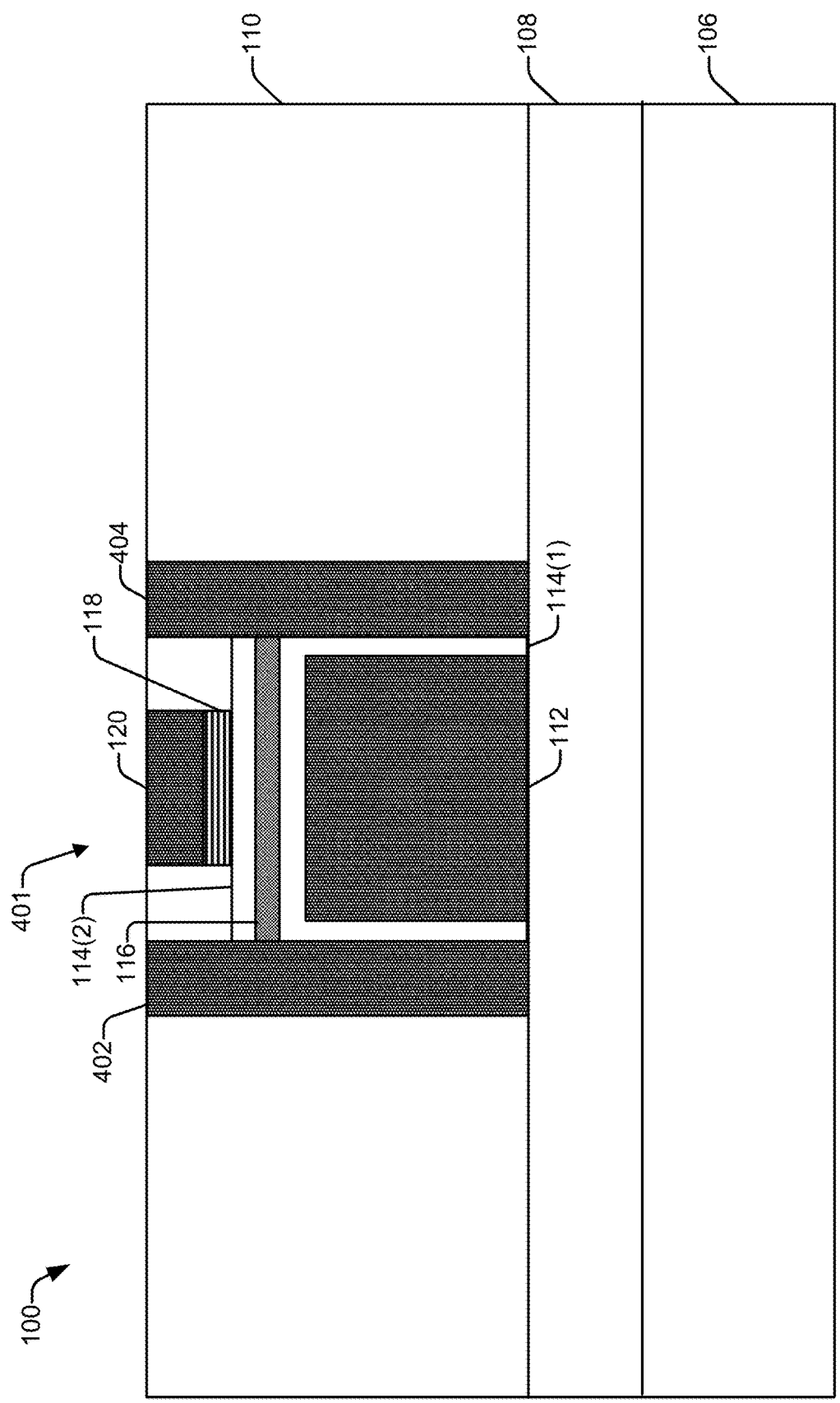
FIG. 4 illustrates a portion of a double gate MOS structure, according to various aspects of the disclosure.

FIG. 4 illustrates a portion 400 of a double gate MOS structure, according to various aspects of the disclosure. FIG. 4 illustrates a y-axis cross-section of the structures similar to the structures 100 and 200. FIG. 4 illustrates the first inter-metal dielectric (IMD) layer 106 (layer x−1), the second IMD 108 (layer x), and the third IMD 110 (layer x+1).

A double gate MOS transistor 401 includes an oxide layer 114(1) that is located on top of and on the sidewalls of the back gate 112(1). The MX2 layer 116(1) is located between the oxide layer 114(1) (e.g., back gate dielectric) and the oxide layer 114(2) (e.g., front gate dielectric). The N-type work-function metal (N-WFM) 118 is located on top of the oxide layer 114(2). It will be appreciated that the work-function metal (WFM) may be either an N-WFM or P-WFM depending on the MOS type. The front gate 120 is located on top of the N-WFM 118. A source 402 and a drain 404 are located on either side of the double gate structure, as show in FIG. 4.

The double gate MOS transistor 401 shown in FIG. 4 may be formed as follows. The back gates 112 may be formed as fins on the IMD layer x 110. An oxide layer (e.g., HfOx or another type of oxide) may be deposited (e.g., as a back gate dielectric) on top of and as a sidewall to the back gates 112. A 2D MX2 film (e.g., a low temperature growth material) may be used for the MX2 layer 116 and added across the sidewall surfaces, to the top of the oxide layer 114(1). The MX2 layer forms the channel of the double gate MOS transistor 401. The oxide layer 114(2) (e.g., HfOx or another type of oxide) may be deposited (e.g., as a front gate dielectric). The N-WFM layer 118 may be deposited on the oxide layer 114(2) of the N-MOS 102 and P-WFM layer 124 may be deposited on the oxide layer 114(2) of the P-MOS 104. Tungsten (W) may be deposited to form the metal front gates 120, 126. A chemical mechanical polish (CMP) may be performed after forming the metal front gates 120, 126.

Figure 5:
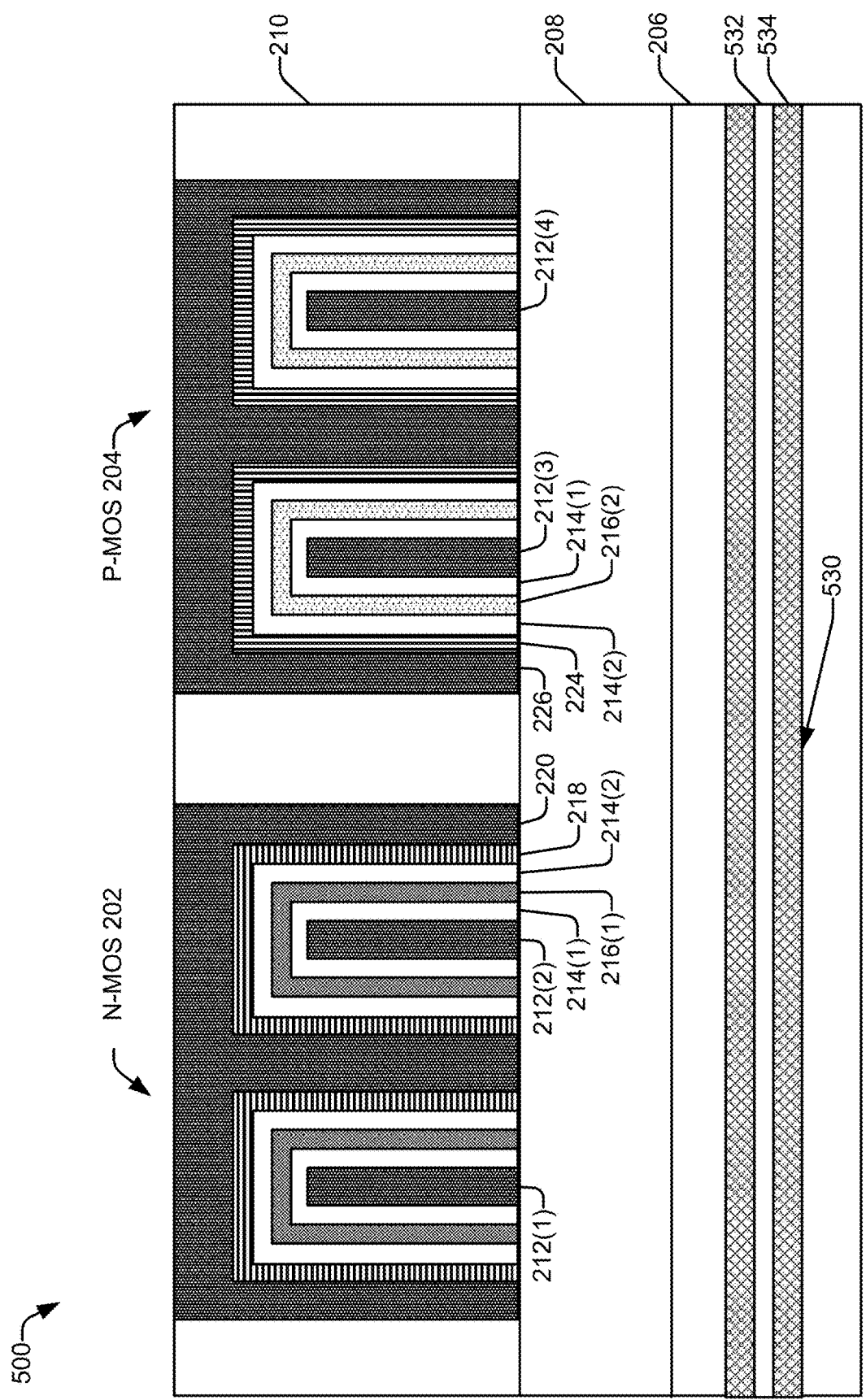
FIG. 5 illustrates a portion of a double gate MOS structure, according to various aspects of the disclosure.

FIG. 5 illustrates a block diagram of a double gate MOS structure 500, according to various aspects of the disclosure. As illustrated in FIG. 5, in some aspects, the structure 200 of FIG. 2A may include an optical waveguide 530 in the inter-metal dielectric (IMD) layer 206 (e.g., layer x−1). The optical waveguide may include a high dielectric constant (high-k) material 532 surrounded by a low dielectric constant (low-k) material 534. The low-k material 534 reflects an optical signal, travelling in the high-k material, guiding it through the optical waveguide. For example, the high-k material 532 may include poly silicon and the low-k material may include an oxide, such as Silicon Nitride (SiN). Light may be confined in the high-k material 532 using internal reflection because a dielectric constant of the high-k material 532 is larger than that of the surrounding low-k material 534. It will be appreciated that a similar configuration can also apply to the structure 100 of FIG. 1, as the lower IMD layers are open according to the various aspects disclosed.

Figure 6:
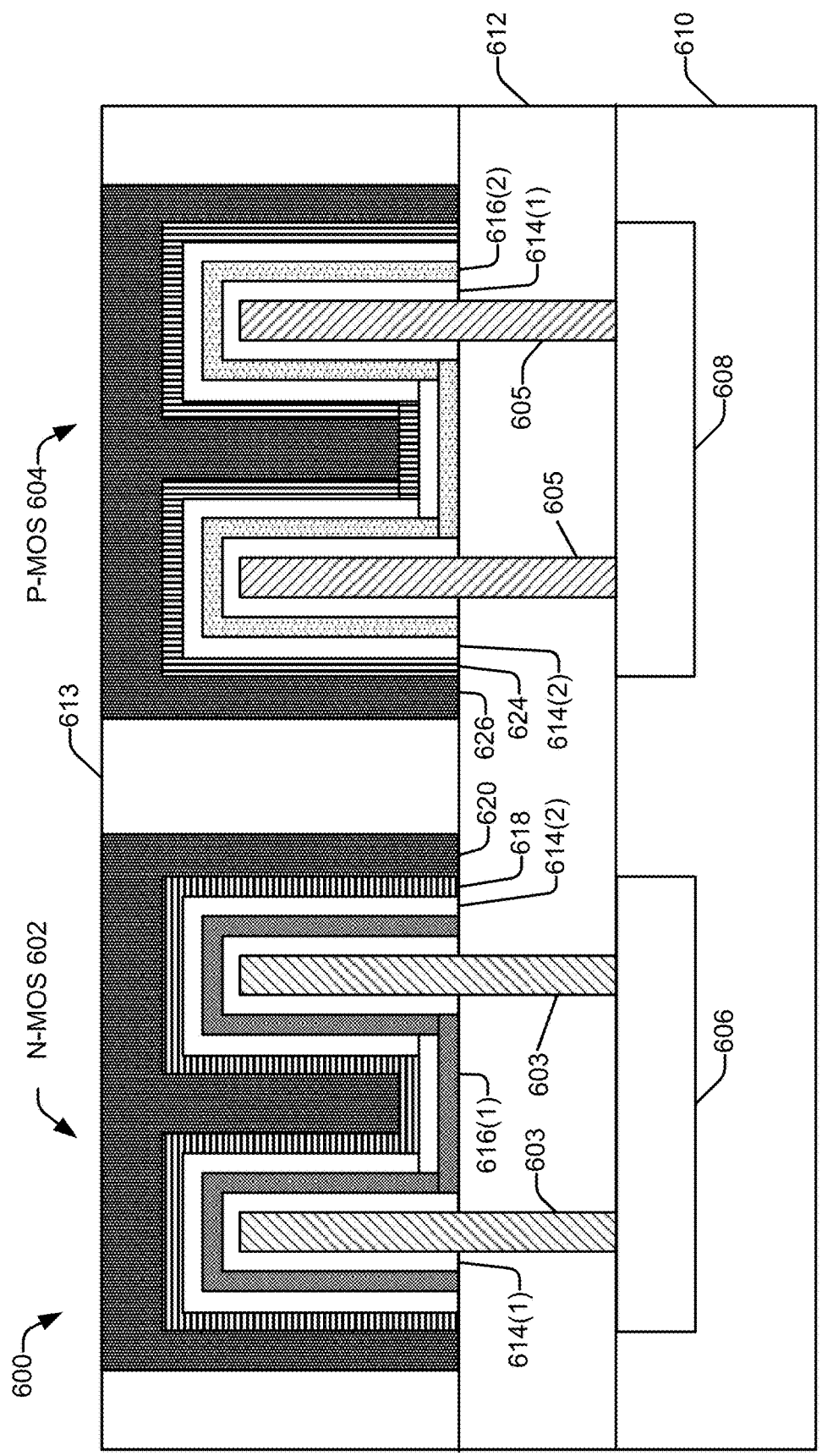
FIG. 6 illustrates a portion of a double gate MOS structure, according to various aspects of the disclosure.

FIG. 6 illustrates a block diagram of a double gate MOS structure 600, according to various aspects of the disclosure. The N-MOS 602 includes back gate fins 603 and the oxide layer 614(1) (back gate dielectric). In some aspects, the oxide layer 614(1) may include Hafnium Oxide (HfOx). In the N-MOS 602, the oxide layer 614(1) may be located between the back gate fins 603 and an MX2 layer 616(1). The second oxide layer 614(2) (e.g., front gate dielectric) may, in some aspects, include HfOx. The N-type work-function metal (N-WFM) layer 618 is located between the oxide layer 614(2) and the front gate 620. The P-MOS 604 includes the oxide layer 614(1). The oxide layer 614(1) may be located between the back gate fins 605 and the MX2 layer 616(2). The P-type work-function metal (P-WFM) layer 624 is located between the oxide layer 614(2) and the front gate 626.

In the structure 600, the N-MOS 602 includes back gate fins 603 and the P-MOS 604 includes back gate fins 605. The back gate fins 603 extend to a P-well 606 (e.g., P-type diffusion over a P-type substrate) and the back gate fins 605 extend to an N-well 608 (e.g., N-type diffusion over a P-type substrate). The structure 600 includes a P-substrate 610, a shallow trench isolation (STI) 612, and an inter-layer dielectric (ILD) 613 (e.g., upper dielectric layer). The STI 612 and ILD 613 are oxide films used at different stages to deposit oxide.

The structure 600 may be formed as follows. The back gate fins 603 are patterned using Silicon with a high N+ dope. The back gate fins 605 are patterned using Silicon with a high P+ dope. An oxide (e.g., HfOx or the like) may be deposited on top of and on the sidewalls of the fins 603, 605 to create the oxide layers 614(1) (e.g., the back gate dielectric). The 2D MX2 film layers 616(1), 616(2) are a low temperature growth from a bottom and sidewalls of the oxide layers 614(1). The oxide layers 614(2) are created by depositing an oxide (e.g., HfOx or the like) as a front gate dielectric. The N-WFM layer 618 may be deposited on the oxide layer 614(2) of the N-MOS 602 and P-WFM layer 624 may be deposited on the oxide layer 614(2) of the P-MOS 604. Tungsten (W) may be deposited to form the metal front gates 620, 626. A chemical mechanical polish (CMP) may be performed to complete forming the structure 200. In the structure 600, the MX2 layers 616(1), 616(2), the oxide layers 614(2), and the WFM layers 618, 624 are linked between the two back gates fins 605 and 603 on the P-MOS 604 and the N-MOS 602, respectively.

It will be appreciated that various aspects disclosed herein can include structure 600 including a back gate WFM layer (e.g., similar to 218(1), 224(1) in structure 240). The structure 600, in some aspects, is modified to include the back gate WFM layers (N-WFM and P-WFM) disposed on the back gate fins 603 and 605 and located between the back gate fins 603 and 605 and the back gate dielectric layer 614. Accordingly, it will be appreciated that the various aspects disclosed are not limited to the example configurations expressly illustrated.

Figure 7:
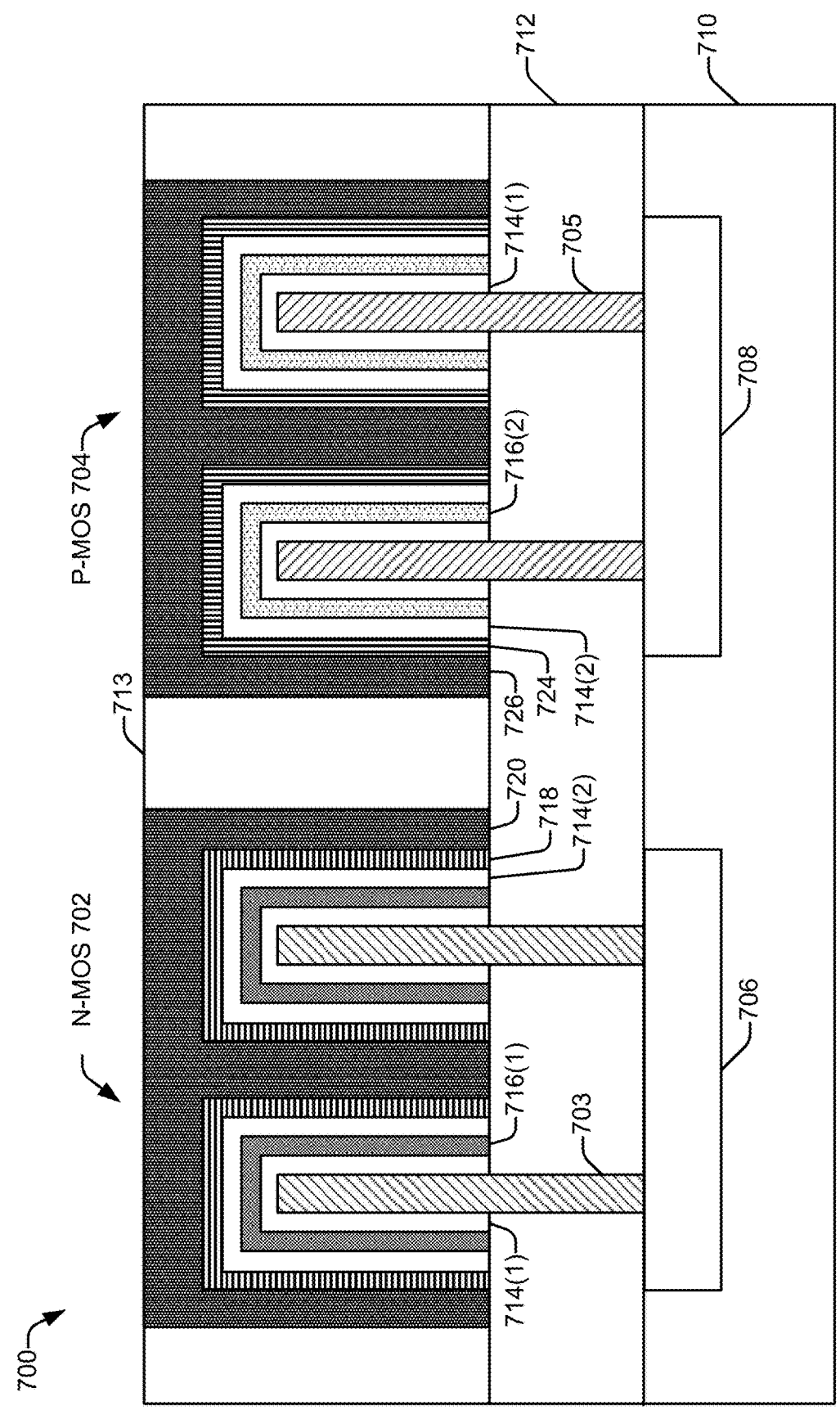
FIG. 7 illustrates a portion of a double gate MOS structure, according to various aspects of the disclosure.

FIG. 7 illustrates a block diagram of a double gate MOS structure 700, according to various aspects of the disclosure. The N-MOS 702 includes the oxide layer 714(1) (back gate dielectric). In some aspects, the oxide layer 714(1) includes Hafnium Oxide (HfOx). In the N-MOS 702, the oxide layer 714(1) may be located between the back gate fins 703 and the MX2 layer 716(1). The second oxide layer 714(2) (e.g., front gate dielectric) may, in some aspects, include HfOx. The N-type work-function metal (N-WFM) layer 718 is located between the oxide layer 714(2) and the front gate 720. The P-MOS 704 includes the oxide layer 714(1). The oxide layer 714(1) may be located between back gate fins 705 and the MX2 layer 716(2). The P-type work-function metal (P-WFM) layer 724 is located between the oxide layer 714(2) and the front gate 726.

In the structure 700, the N-MOS 702 includes back gate fins 703 and the P-MOS 704 includes back gate fins 705. The back gates fins 703 extend to the P-well 706 and the back gate fins 705 extend to the N-well 708. The structure 700 includes a P-substrate 710, a shallow trench isolation (STI) 712, and an inter-layer dielectric (ILD) 713 (e.g., upper dielectric layer).

The structure 700 may be formed as follows. The back gate fins 703 are patterned using Silicon with a high N+ dope. The back gate fins 705 are patterned using Silicon with a high P+ dope. An oxide (e.g., HfOx or the like) may be deposited on top of and on the sidewalls of the fins 703, 705 to create the oxide layers 714(1) (e.g., the back gate dielectric). The 2D MX2 film layers 716(1), 716(2) are disposed on the bottom and sidewalls of the oxide layers 714(1). The oxide layers 714(2) are created by depositing an oxide (e.g., HfOx or the like) as a front gate dielectric. The N-WFM layer 718 may be deposited on the oxide layer 714(2) of the N-MOS 702 and P-WFM layer 724 may be deposited on the oxide layer 714(2) of the P-MOS 704. Tungsten (W) may be deposited to form the metal front gates 720, 726. A chemical mechanical polish (CMP) may be performed to complete forming the structure 700. In the structure 700, the MX2 layers 716(1), 716(2), the oxide layers 714(2), and the WFM layers 718, 724 are not linked between the two gates for the P-MOS 704 and for the N-MOS 702.

It will be appreciated that various aspects disclosed herein can include structure 700 including a back gate WFM layer (e.g., similar to 218(1), 224(1) in structure 240). The structure 700, in some aspects, is modified to include the back gate WFM layers (N-WFM and P-WFM) disposed on the back gate fins 703 and 705 and located between the back gate fins 703 and 705 and the back gate dielectric layer 714. Accordingly, it will be appreciated that the various aspects disclosed are not limited to the example configurations expressly illustrated.

Figure 8:
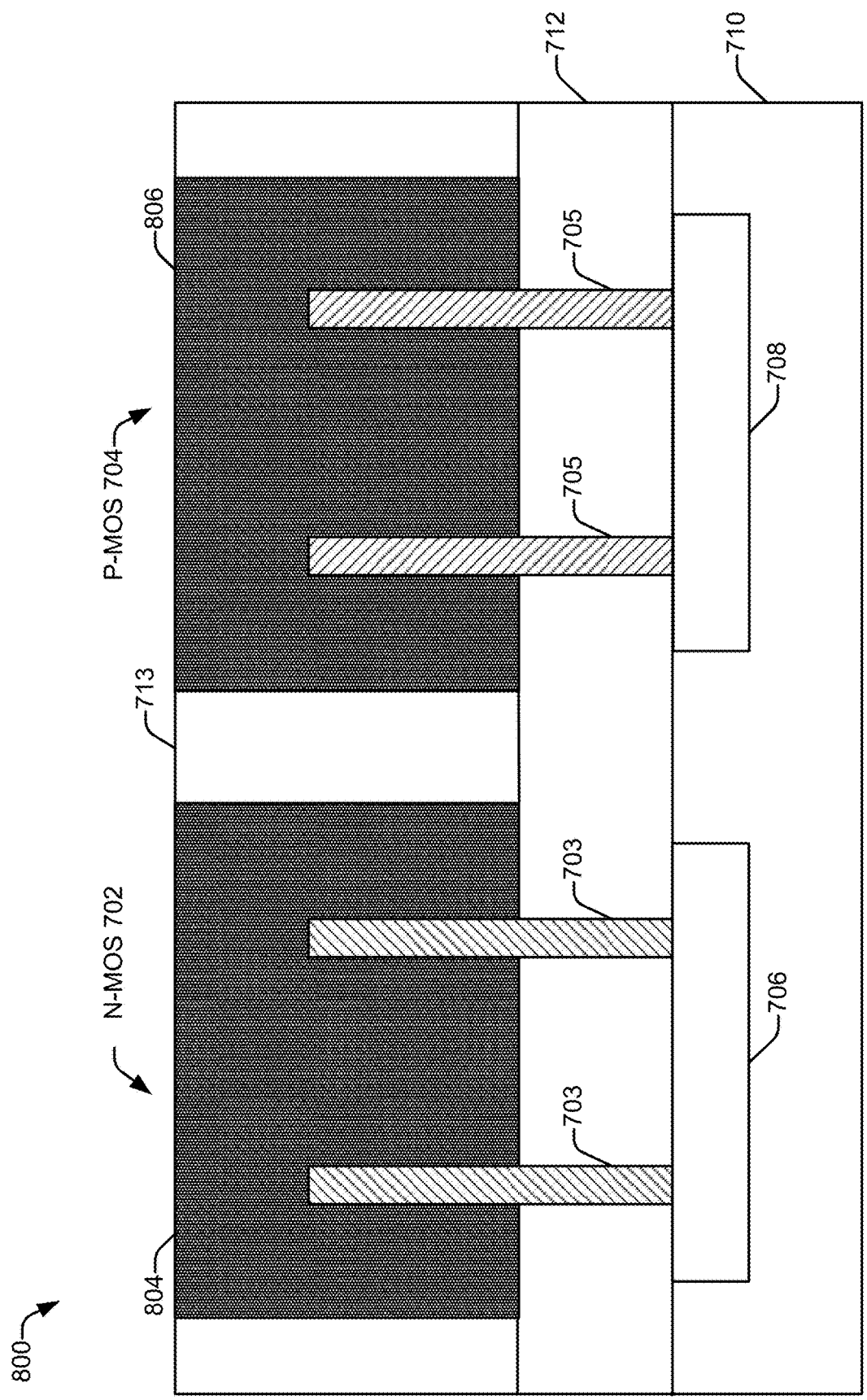
FIG. 8 illustrates a portion of a double gate MOS structure, according to various aspects of the disclosure.

FIG. 8 illustrates a block diagram of a double gate MOS structure 800, according to various aspects of the disclosure. FIG. 8 illustrates an x-axis (e.g., with the fins projecting out of the page) view of the structures illustrated in FIG. 6 and FIG. 7. In the structure 800, the N-MOS 702 includes back gate fins 703 and the P-MOS 704 includes back gate fins 705. The back gates fins 703 extend to the P-well 706 and the back gate fins 705 extend to the N-well 708. The structure 800 includes a P-substrate 710, a shallow trench isolation (STI) 712, and an inter-layer dielectric (ILD) 713. Back gate contact 804 is coupled to back gate fins 703 and back gate contact 806 is coupled to back gate fins 705. During manufacturing, the back gate fins (e.g., 703, 705) are patterned, a conductive metal (e.g., Tungsten (W)) is deposited, and a chemical mechanical polish (CMP) is performed to form the back gate contacts 804 and 806, which are located in ILD 713.

Figure 9:
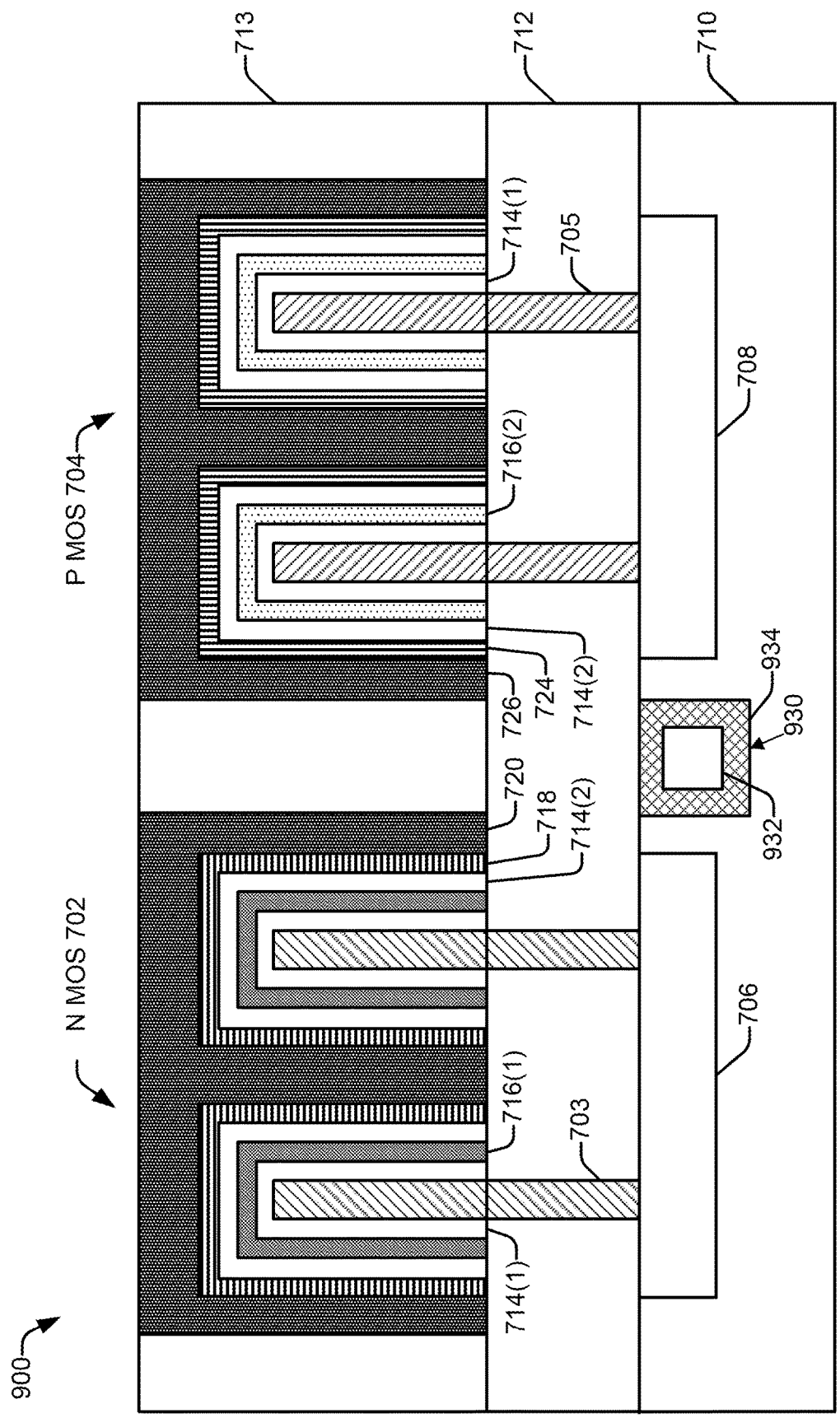
FIG. 9 illustrates a portion of a double gate MOS structure, according to various aspects of the disclosure.

FIG. 9 illustrates a block diagram of a double gate MOS structure 900, according to various aspects of the disclosure. FIG. 9 illustrates an x-axis view of the structure 900 shown in FIG. 7. In the structure 900, the N-MOS 702 includes back gate fins 703 and the P-MOS 704 includes back gate fins 705. The back gates fins 703 extend to the P-well 706 and the back gate fins 705 extend to the N-well 708. The structure 900 includes a P-substrate 710, a shallow trench isolation (STI) 712, and an inter-layer dielectric (ILD) 713. The structure 900 includes an optical waveguide 930 disposed between P-well 706 and N-well 708. The optical waveguide 930 may be formed from high-k material 932 surrounded by the low-k material 934, which in some aspects, may be similar to the optical wave guide discussed in relation to FIG. 5.

Figure 10A:
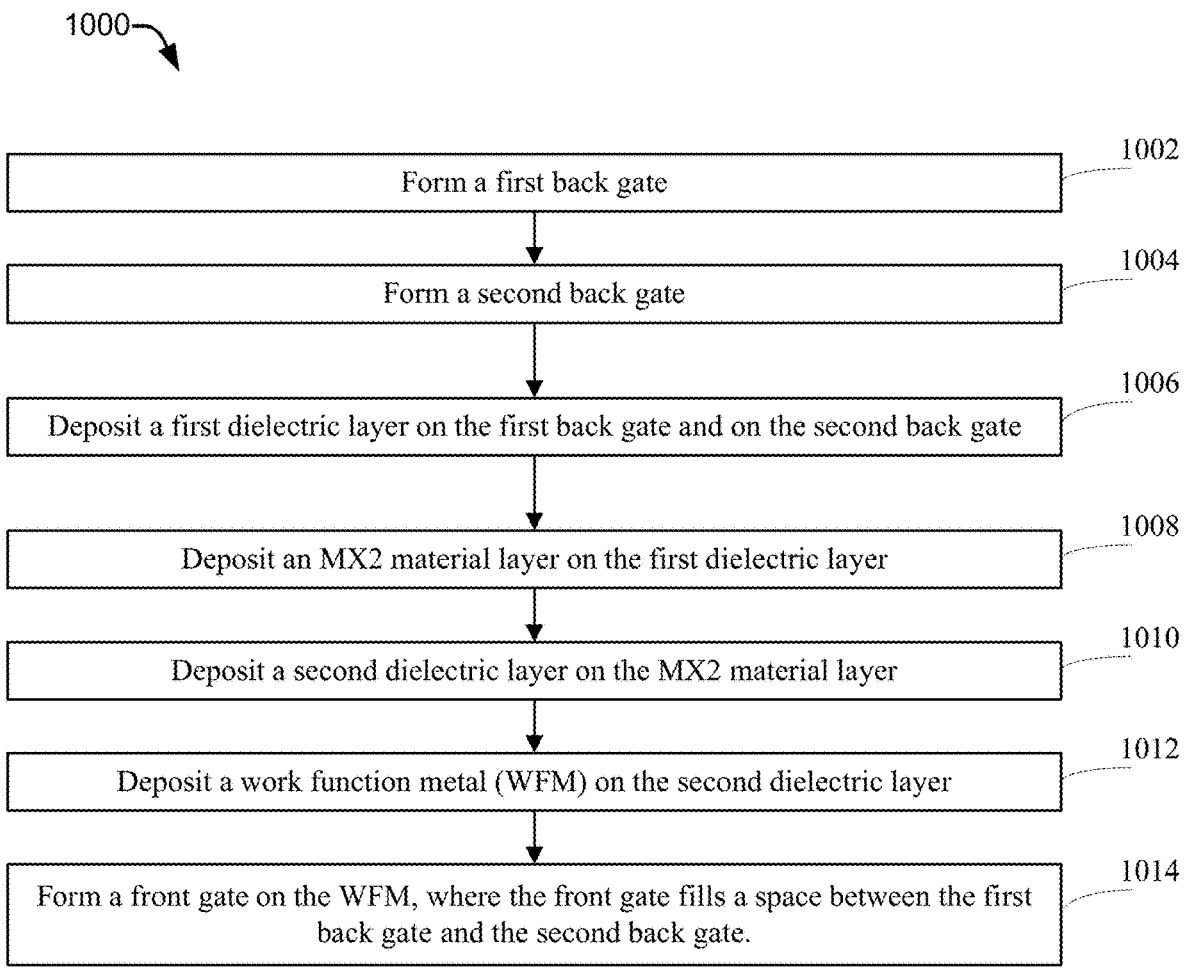
FIG. 10A illustrates a process to form a double gate MOS structure, according to various aspects of the disclosure.
Figure 10B:
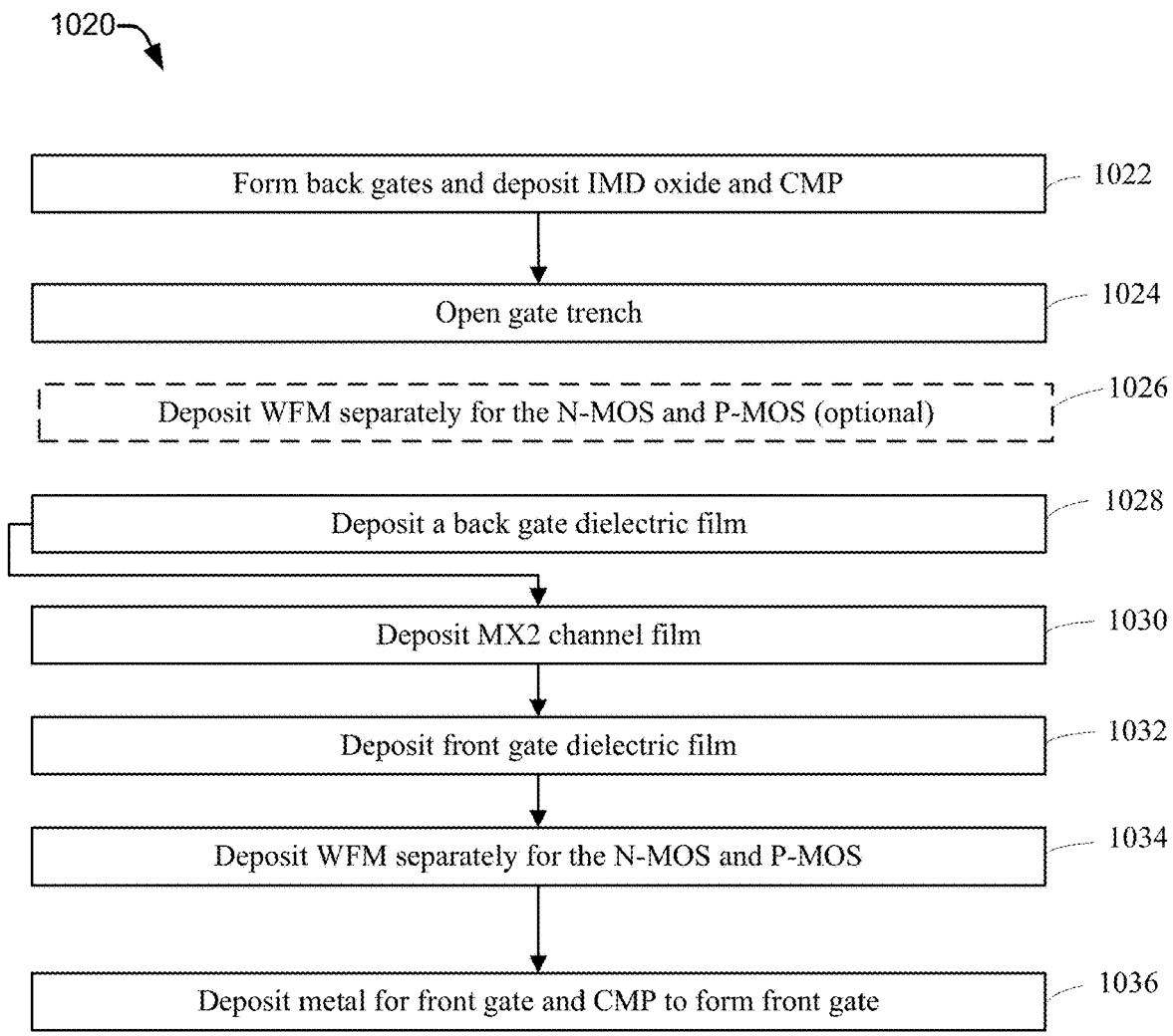
FIG. 10B illustrates a process to form a double gate MOS structure, according to various aspects of the disclosure.
Figure 10C:
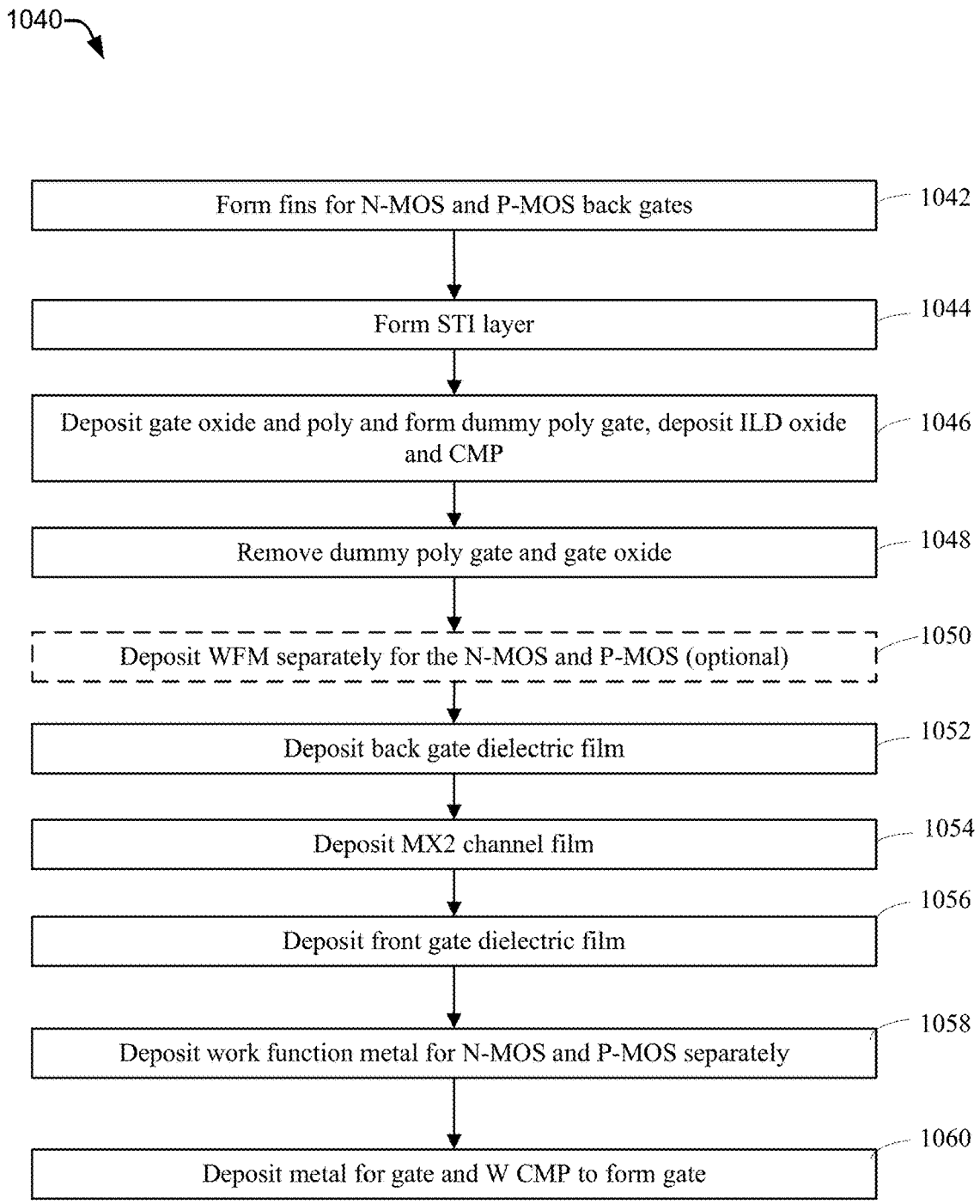
FIG. 10C illustrates a process to form a double gate MOS structure, according to various aspects of the disclosure.

In the flow diagrams of FIGS. 10A, 10B and 10C each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 1000 is described with reference to FIGS. 1, 2, 3, 4, 5, 6, 7, 8, and 9 as described above, although other models, frameworks, systems, and environments may be used to implement these processes.

FIG. 10A illustrates a process 1000 to form a double gate MOS structure, according to various aspects of the disclosure. The process 1000 may be performed as part of a semiconductor manufacturing process.

At 1002, the process 1000 may form a first back gate (e.g., 112(1), 212(1), 603, 703, etc.). At 1004, the process 1000 may form a second back gate (e.g., 112(2), 212(2), 603, 703, etc.). At 1006, the process 1000 may deposit the first dielectric layer 114(1) (e.g., HfOx or another type of oxide) on both sidewalls and a top of the first back gate and on both sidewalls and a top of the second back gate. At 1008, the process 1000 may deposit a 2D MX2 film (e.g., a low temperature growth material) across sidewall surfaces and top surfaces of the dielectric 114(1) to create the MX2 layers 116(1), 116(2). In some aspects (e.g., the structure 100 of FIG. 1 and the structure 600 of FIG. 6), the process 1000 may include depositing MX2 film to link the MX2 layers 116(1) between the two back gates 112 of the N-MOS 102 and to link the MX2 layers 116(2) between the two back gates 112 of the P-MOS 104. In other aspects (e.g., the structure 200 of FIG. 2A, the structure 500 of FIG. 5, the structure 7 of FIG. 7, and the structure 900 of FIG. 9), the process 1000 may not link the MX2 layers 116(1) between the two back gates 112 of the N-MOS 102 and may not link the MX2 layers 116(2) between the two back gates 112 of the P-MOS 104. For example, an etch back process may be used to remove specific layers. At 1010, the process 1000 may deposit a second dielectric layer 114(2) (e.g., HfOx or another type of oxide) to create a front gate dielectric. In some aspects (e.g., the structure 100 of FIG. 1 and the structure 600 of FIG. 6), the process 1000 may include depositing the second dielectric layer 114(2) to link the two back gates 112 of the N-MOS 102 and to link the second oxide layers 114(2) (e.g., dielectrics) between the two back gates 112 of the P-MOS 104. In other aspects (e.g., the structure 200 of FIG. 2A, the structure 500 of FIG. 5, the structure 7 of FIG. 7, and the structure 900 of FIG. 9), the process 1000 may not link the second oxide layers 114(2) (e.g., dielectrics) between the two back gates 112 of the N-MOS 102 and may not link the second oxide layers 114(2) (e.g., dielectrics) between the two back gates 112 of the P-MOS 104. At 1012, the process 1000 may deposit a work function metal (WFM) on the second dielectric layer. For example, the process 1000 may deposit the N-WFM layer 118 on the dielectric 114(2) of the N-MOS 102 and deposit the P-WFM layer 124 on the dielectric 114(2) of the P-MOS 104. In some aspects (e.g., the structure 100 of FIG. 1 and the structure 600 of FIG. 6), the process 1000 may include depositing the N-WFM layer 118 to link the two back gates 112 of the N-MOS 102 and depositing the P-WFM layer 124 to link the second oxide layers 114(2) (e.g., dielectrics) between the two back gates 112 of the P-MOS 104. In other aspects (e.g., the structure 200 of FIG. 2A, the structure 500 of FIG. 5, the structure 7 of FIG. 7, and the structure 900 of FIG. 9), the process 1000 may deposit the N-WFM without linking the N-WFM layer 118 between the two back gates 112 of the N-MOS 102 and deposit the P-WFM without linking the P-WFM layer 124 between the two back gates 112 of the P-MOS 104. At 1014, the process 1000 forms front gate on the WFM, where the front gate fills a space between the first back gate and the second back gate. The front gate may be formed by depositing Tungsten (W) to form the front gates 120, 126.

FIG. 10B illustrates a process 1020 to form a double gate MOS structure, according to various aspects of the disclosure. The process 1020 may be performed as part of a semiconductor manufacturing process and generally relates to the various configurations disclosed in relation to FIGS. 1-5.

At 1022, the process 1020 may form the back gates (e.g., 2 fin for the N-MOS and 2 fins for the P-MOS), deposit an IMD oxide and perform a CMP process. At 1024, the process 1020 may open gate trenches in the IMD (e.g., one for each gate or one combined for the N-MOS and one combined for the P-MOS). At 1026, the process 1020 may optionally deposit a back gate (or first) WFM separately for the N-MOS and P-MOS over the respective back gates. At 1028, the process 1020 may deposit a back gate dielectric film (e.g., a first dielectric layer), which may be a high-k dielectric such as HfOx, AlO₃ or similar dielectric materials. The back gate dielectric film will be deposited over the back gate WFM (if deposited) or the back gates if no back gate WFM. At 1030, the process 1020 may deposit an MX2 channel film over the back gate dielectric film in the gate trenches. At 1032, the process 1020 may deposit a front gated dielectric film (e.g., second dielectric layer), which may be a high-k dielectric. At 1034, the process 1020 may deposit a front gate WFM (or second WFM) on the front gate dielectric film separately for the N-MOS and P-MOS. For example, the process 1020 may deposit the N-WFM layer on the front gate dielectric in the N-MOS trench and deposit the P-WFM layer on the from gate dielectric in the P-MOS trench. At 1036, the process 1020 may deposit metal for the front gate and perform a CMP process to form the front gate for the N-MOS and P-MOS, respectively. For example, a metal (e.g., W) can be deposited over the WMF layers in gate trenches and fill the spaces between the first back gate and the second back gate of the N-MOS and P-MOS back gates. After the CMP process the front the gates will be planarized and may have an "M" or "W" shape, such as illustrated in structure 100, for front gates 120 and 126.

FIG. 10C illustrates a process 1040 to form a double gate MOS structure, according to various aspects of the disclosure. The process 1040 may be performed as part of a semiconductor manufacturing process and generally relates to the various configurations disclosed in relation to FIGS. 6-9.

At 1042, the process 1040 may form the fins for the N-MOS and P-MOSE back gates. For example, for the N-MOS, the back gate fins (e.g. 603, 703) may be highly doped N+ extending from a P-well (e.g., 606, 706) and the P-MOS back gate fins (e.g., 605, 705) extend to an N-well (e.g., 608, 708). The P-Well and N-Well may be formed in a P-substrate (e.g., 610, 710)

At 1044, the process 1040 may form a shallow trench isolation (STI) layer (e.g., 612, 712) by depositing an oxide on the P-substrate. At 1046, the process 1040 may deposit a gate oxide and poly to form dummy poly gates (N and P), deposit an inter-layer dielectric (ILD) (e.g., 613, 713) and perform a CMP process. At 1048, the process 1040 may remove the gate oxide and dummy poly gates to form trenches for the double gate structure formation.

At 1050, the process 1040 may optionally deposit a back gate (or first) WFM separately for the N-MOS and P-MOS over the respective back gates. At 1052, the process 1040 may deposit a back gate dielectric film (e.g., a first dielectric layer), which may be a high-k dielectric such as HfOx, AlO₃ or similar dielectric materials. The back gate dielectric film will be deposited over the back gate WFM (if deposited) or the back gates if no back gate WFM. At 1054, the process 1040 may deposit an MX2 channel film over the back gate dielectric film. At 1056, the process 1040 may deposit a front gated dielectric film (e.g., second dielectric layer), which may be a high-k dielectric. At 1058, the process 1040 may deposit a front gate WFM (or second WFM) on the front gate dielectric film separately for the N-MOS and P-MOS. For example, the process 1040 may deposit the N-WFM layer on the front gate dielectric in the N-MOS portion (e.g., over back gate fins (e.g., 603, 703) and deposit the P-WFM layer on the from gate dielectric in the P-MOS portion (e.g., over back gate fins (e.g., 605, 705). At 1060, the process 1040 may deposit metal for the front gate and perform a CMP process to form the front gate for the N-MOS and P-MOS, respectively. For example, a metal (e.g., W) can be deposited over the WMF layers in gate trenches and fill the spaces between the first back gate and the second back gate of the N-MOS and P-MOS back gates. After the CMP process, the front of the gates may be planarized and may have an "M" or "W" shape, such as illustrated in structure 600, for front gates 620 and 626.

Figure 11:
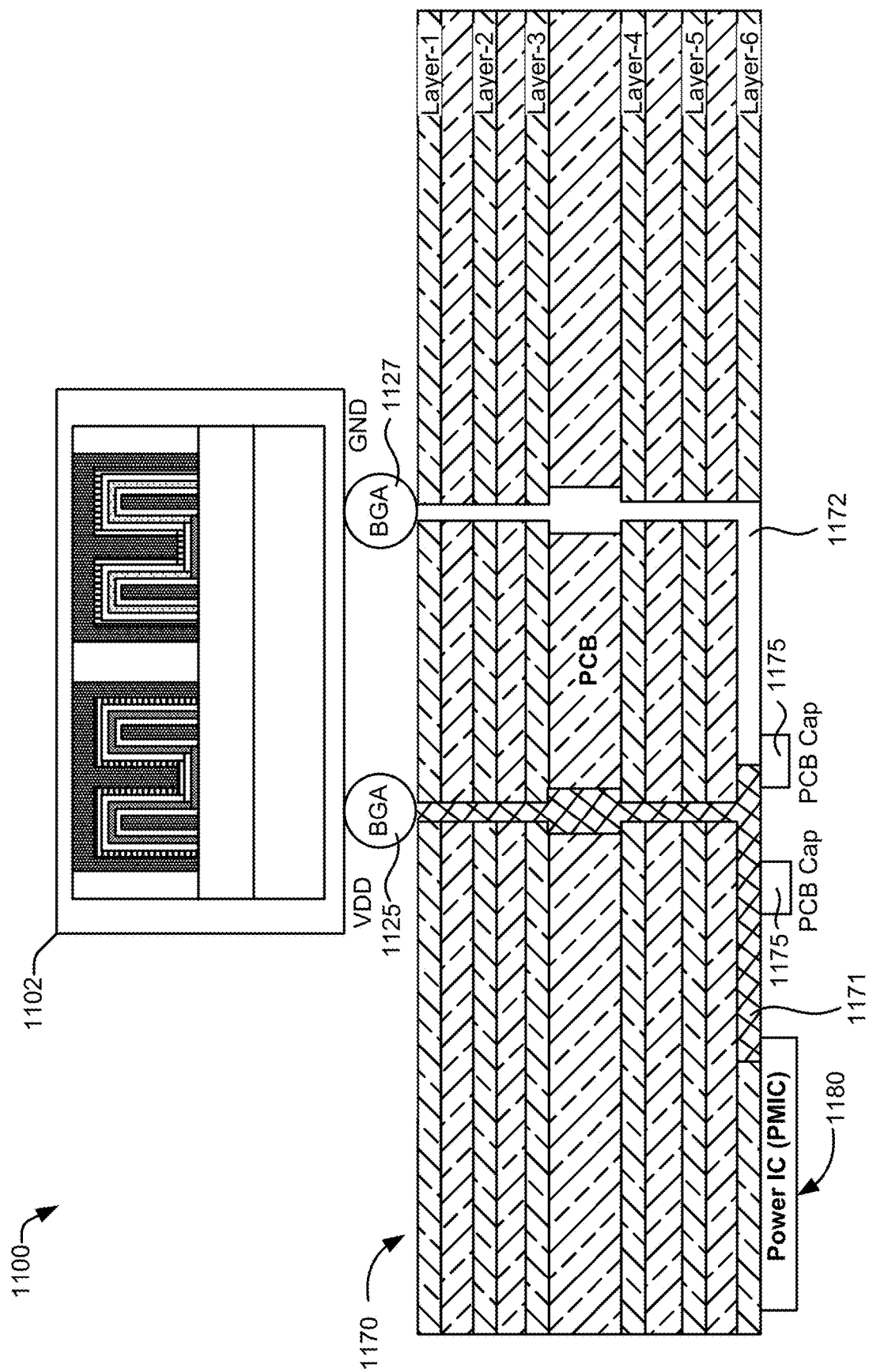
FIG. 11 illustrates components of an integrated device in accordance with one or more aspects of the disclosure.

FIG. 11 illustrates components of an integrated device 1100 according to one or more aspects of the disclosure. Regardless of the various techniques discussed above, it will be appreciated that a semiconductor 1102 (which may contain multiple dies/chiplets, etc.) may be configured to couple to a PCB 1170. The semiconductor 1102 may include the structure 100, 200, 300, 400, 500, 600, 700, 800, 900, or any combination thereof. The PCB 1170 is also coupled to a power supply 1180 (e.g., a power management integrated circuit (PMIC)), which allows the semiconductor 1102 to be electrically coupled to the PMIC 1180. In some aspects, it will be appreciated that a package substrate integrated into a package with the semiconductor 1102 and the package substrate may be used to electrically couple the semiconductor 1102 and PCB 1170. In some aspects, one or more power supply (VDD) lines 1171 and one or more ground (GND) lines 1172 may be coupled to the PMIC 1180 to distribute power to the PCB 1170, semiconductor 1102 via VDD BGA pin 1125 and GND BGA pin 1127. The VDD line 1171 and GND line 1172 each may be formed from traces, shapes, or patterns in one or more metal layers of the PCB 1170 (e.g., layers 1-6) coupled by one or more vias through insulating layers separating the metal layers 1-6 in the PCB 1170. The PCB 1170 may have one or more PCB capacitors (PCB cap) 1175 that can be used to condition the power supply signals, as is known to those skilled in the art. Additional connections and devices may be coupled to and/or pass through the PCB 1170 to the semiconductor 1102 via one or more additional BGA pins (not illustrated) on the semiconductor 1102. It will be appreciated that the illustrated configuration and descriptions are provided merely to aid in the explanation of the various aspects disclosed herein. For example, the PCB 1170 may have more or less metal and insulating layers, there may be multiple lines providing power to the various components, etc. Accordingly, the forgoing illustrative examples and associated figures should not be construed to limit the various aspects disclosed and claimed herein.

In accordance with the various aspects disclosed herein, at least one aspect includes a double gate structure with MX2 material. Other technical advantages will be recognized from various aspects disclosed herein and these technical advantages are merely provided as examples and should not be construed to limit any of the various aspects disclosed herein.

Figure 12:
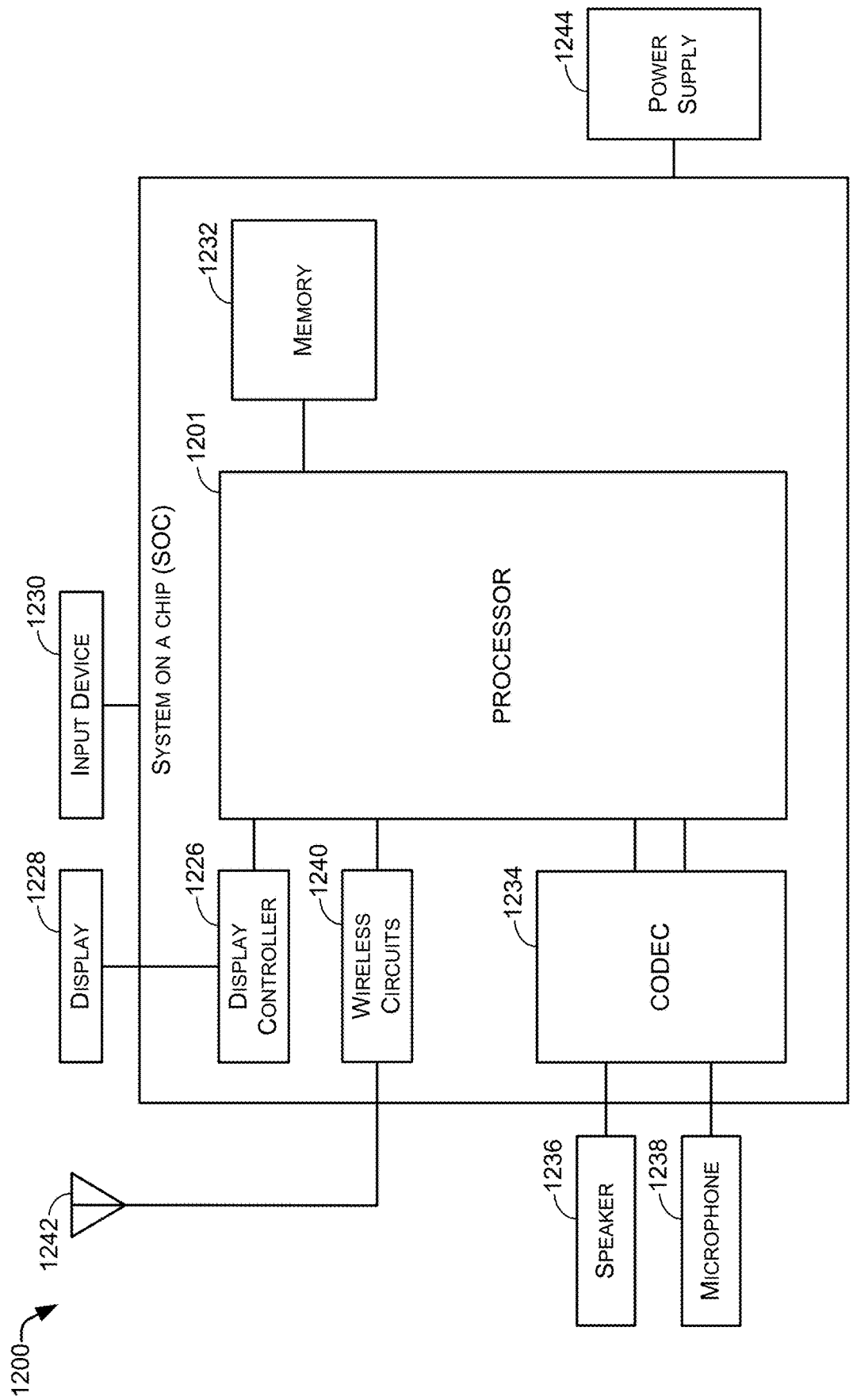
FIG. 12 illustrates a mobile device in accordance with one or more aspects of the disclosure.

FIG. 12 illustrates a mobile device 1200 in accordance with some examples of the disclosure. Referring now to FIG. 12, a block diagram of a mobile device that is configured according to various aspects disclosed herein and is depicted and generally designated mobile device 1200. In some aspects, mobile device 1200 may be configured as a wireless communication device. As shown, mobile device 1200 includes processor 1201. Processor 1201 may be communicatively coupled to memory 1232 over a link, which may be a die-to-die or chip-to-chip link. Processor 1201 is a hardware device capable of executing logic instructions. Mobile device 1200 also includes display 1228 and display controller 1226, with display controller 1226 coupled to processor 1201 and to display 1228.

In some aspects, FIG. 12 may include coder/decoder (CODEC) 1234 (e.g., an audio and/or voice CODEC) coupled to processor 1201; speaker 1236 and microphone 1238 coupled to CODEC 1234; and wireless circuits 1240 (which may include a modem, RF circuitry, filters, etc.) coupled to wireless antenna 1242 and to processor 1201.

In a particular aspect, where one or more of the above-mentioned blocks are present, processor 1201, display controller 1226, memory 1232, CODEC 1234, and wireless circuits 1240 can include the gate structure 200 which may be implemented in whole or part using the techniques disclosed herein. Input device 1230 (e.g., physical or virtual keyboard), power supply 1244 (e.g., battery), display 1228, input device 1230, speaker 1236, microphone 1238, wireless antenna 1242, and power supply 1244 may be external to device 1200 and may be coupled to a component of device 1200, such as an interface or a controller.

It should be noted that although FIG. 12 depicts a mobile device 1200, processor 1201 and memory 1232 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 13:
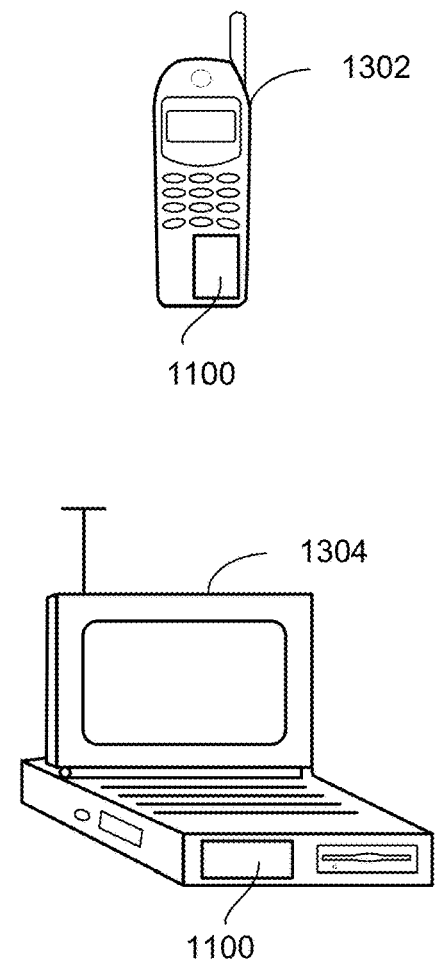
FIG. 13 illustrates various electronic devices that may be integrated with an integrated device or a semiconductor device in accordance with one or more aspects of the disclosure.
Figure 13:
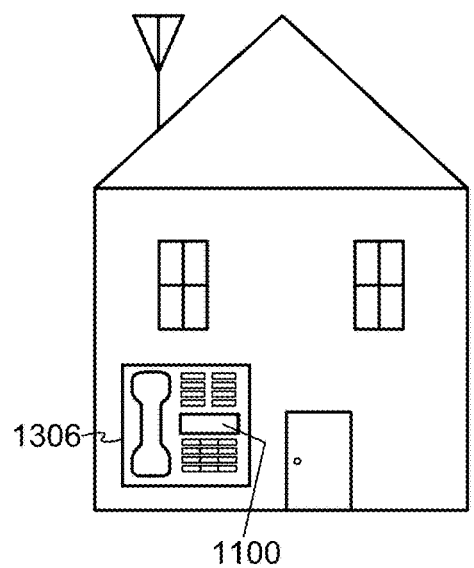

FIG. 13 illustrates various electronic devices that may be integrated with any of the aforementioned integrated device or semiconductor device accordance with various examples of the disclosure. For example, a mobile device 1302, a laptop computer device 1304, and a fixed location terminal device 1306 may each be considered generally user equipment (UE) and may include semiconductor 1100 (e.g., including one or more of 100, 200, 300, 400, 500, 600, 700, 800, 900 or any combination thereof) as described herein. The semiconductor 1100 may be, for example, be included in any of the integrated circuits, dies, integrated devices, integrated device packages, integrated circuit devices, device packages, integrated circuit (IC) packages, package-on-package devices described herein. The devices 1302, 1304, 1306 illustrated in FIG. 13 are merely exemplary. Other electronic devices may also feature the semiconductor 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It can be noted that, although particular frequencies, integrated circuits (ICs), hardware, and other features are described in the aspects herein, alternative aspects may vary. That is, alternative aspects may utilize additional or alternative frequencies (e.g., other the 60 GHz and/or 28 GHz frequency bands), antenna elements (e.g., having different size/shape of antenna element arrays), scanning periods (including both static and dynamic scanning periods), electronic devices (e.g., WLAN APs, cellular base stations, smart speakers, IoT devices, mobile phones, tablets, personal computer (PC), etc.), and/or other features. A person of ordinary skill in the art will appreciate such variations.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

As used herein, the terms "user equipment" (UE) and "base station" are not intended to be specific or otherwise limited to any particular radio access technology (RAT), unless otherwise noted. In general, a UE may be any wireless communication device (e.g., a mobile phone, router, tablet computer, laptop computer, consumer asset tracking device, wearable device (e.g., smartwatch, glasses, augmented reality (AR)/virtual reality (VR) headset, etc.), vehicle (e.g., automobile, motorcycle, bicycle, etc.), Internet of Things (IoT) device, etc.) used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile device," a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on Institute of Electrical and Electronics Engineers (IEEE) 802.11, etc.) and so on.

A base station may operate according to one of several RATs in communication with UEs depending on the network in which it is deployed, and may be alternatively referred to as an access point (AP), a network node, a NodeB, an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems a base station may provide purely edge node signaling functions while in other systems it may provide additional control and/or network management functions.

An "RF signal" comprises an electromagnetic wave of a given frequency that transports information through the space between a transmitter and a receiver. As used herein, a transmitter may transmit a single "RF signal" or multiple "RF signals" to a receiver. However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal," a "radar signal," a "radio wave," a "waveform," or the like, or simply a "signal" where it is clear from the context that the term "signal" refers to a wireless signal or an RF signal.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause. Implementation examples are described in the following numbered clauses:

Clause 1. An apparatus comprising a double gate metal oxide semiconductor (MOS) transistor, wherein the double gate MOS transistor comprises: a first back gate; a second back gate; a first dielectric layer disposed on the first back gate and on the second back gate; an MX2 material layer disposed on the first dielectric layer; a second dielectric layer disposed on the MX2 material layer; a work function metal (WFM) disposed on the second dielectric layer; and a front gate disposed on the WFM, wherein the front gate fills a space between the first back gate and the second back gate.

Clause 2. The apparatus of clause 1, wherein the first back gate, the second back gate, and the front gate each comprises Tungsten (W), Titanium (Ti), Titanium Nitride (TiN), Tantalum (Ta), Tantalum Nitride (TaN), or poly silicon.

Clause 3. The apparatus of any of clauses 1 to 2, wherein the first dielectric layer and the second dielectric layer comprise Hafnium Oxide (HfOx).

Clause 4. The apparatus of any of clauses 1 to 3, wherein the MX2 material layer disposed over the first back gate is coupled to the MX2 material layer disposed over the second back gate, and the second dielectric layer disposed over the first back gate is coupled to the second dielectric layer disposed over the second back gate.

Clause 5. The apparatus of any of clauses 1 to 3, wherein the MX2 material layer disposed over the first back gate is separated from the MX2 material layer disposed over the second back gate, and the second dielectric layer disposed over the first back gate is separated from the second dielectric layer disposed over the second back gate.

Clause 6. The apparatus of any of clauses 1 to 5, wherein the MX2 material layer comprises a layer of transition metal atoms between two layers of chalcogen atoms.

Clause 7. The apparatus of clause 6, wherein the layer of transition metal atoms comprises at least one of: Molybdenum (Mo), Tungsten (W), Tin (Sn), Hafnium (Hf), Zirconium (Zr), Platinum (Pt), or any combination thereof.

Clause 8. The apparatus of any of clauses 6 to 7, wherein the layers of chalcogen atoms comprise at least one of: Sulphur (S), Selenium (Se), Tellurium (Te), or any combination thereof.

Clause 9. The apparatus of any of clauses 1 to 8, wherein the WFM is an N-type WFM or a P-type WFM.

Clause 10. The apparatus of any of clauses 1 to 9, wherein the double gate MOS transistor is an N-type MOS (N-MOS) transistor or a P-type MOS (P-MOS) transistor.

Clause 11. The apparatus of any of clauses 1 to 10, further comprising: an upper dielectric layer, wherein at least a portion of the double gate MOS transistor is in the upper dielectric layer.

Clause 12. The apparatus of clause 11, further comprising: an optical waveguide located in a lower dielectric layer below the double gate MOS transistor and the upper dielectric layer.

Clause 13. The apparatus of any of clauses 11 to 12, further comprising: a shallow trench isolation layer located below the upper dielectric layer; and a silicon substrate located below the shallow trench isolation layer.

Clause 14. The apparatus of clause 13, wherein, the first back gate comprises a first fin that comprises N+ doped Silicon, wherein the first back gate is coupled to a P-well disposed in the silicon substrate; and the second back gate comprises a second fin that comprises N+ doped Silicon, wherein the second back gate is coupled to the P-well disposed in the silicon substrate.

Clause 15. The apparatus of any of clauses 13 to 14, wherein, the first back gate comprises a first fin that comprises P+ doped Silicon, wherein the first back gate is coupled to an N-well disposed in the silicon substrate; and the second back gate comprises a second fin that comprises P+ doped Silicon, wherein the second back gate is coupled to the N-well disposed in the silicon substrate.

Clause 16. The apparatus of any of clauses 13 to 15, further comprising: an optical waveguide located in the silicon substrate.

Clause 17. The apparatus of any of clauses 1 to 16, further comprising: a back gate contact, wherein the back gate contact directly coupled to the first back gate and the second back gate.

Clause 18. The apparatus of clause 17, wherein the back gate contact is formed from a portion of the front gate.

Clause 19. The apparatus of any of clauses 1 to 18, further comprising a second double gate metal MOS transistor, wherein the second double gate MOS transistor comprises: a first back gate; a second back gate; a first dielectric layer disposed on sidewalls and a top of the first back gate and disposed on sidewalls and a top of the second back gate; an MX2 material layer disposed on the first dielectric layer; a second dielectric layer disposed on the MX2 material layer; a work function metal (WFM) disposed on the second dielectric layer; and a front gate disposed on the WFM, wherein the front gate fills a space between the first back gate and the second back gate.

Clause 20. The apparatus of clause 19, wherein the second double gate MOS transistor is a P-type MOS transistor and the double gate MOS transistor is an N-type MOS transistor.

Clause 21. The apparatus of any of clauses 1 to 20, further comprising: a back gate WFM disposed on the first back gate and on the second back gate, wherein the back gate WFM is located between the first dielectric layer and the first back gate and the second back gate.

Clause 22. The apparatus of any of clauses 1 to 21, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

Clause 23. A method for fabricating a double gate metal oxide semiconductor (MOS) transistor, comprising: forming a first back gate; forming a second back gate; depositing a first dielectric layer on the first back gate and on the second back gate; depositing an MX2 material layer on the first dielectric layer; depositing a second dielectric layer on the MX2 material layer; depositing a work function metal (WFM) on the second dielectric layer; and forming a front gate on the WFM, wherein the front gate fills a space between the first back gate and the second back gate.

Clause 24. The method of clause 23, wherein the MX2 material layer disposed over the first back gate is coupled to the MX2 material layer disposed over the second back gate, and the second dielectric layer disposed over the first back gate is coupled to the second dielectric layer disposed over the second back gate.

Clause 25. The method of clause 23, wherein the MX2 material layer disposed over the first back gate is separated from the MX2 material layer disposed over the second back gate, and the second dielectric layer disposed over the first back gate is separated from the second dielectric layer disposed over the second back gate.

Clause 26. The method of any of clauses 23 to 25, wherein the MX2 material layer comprises a layer of transition metal atoms between two layers of chalcogen atoms.

Clause 27. The method of clause 26, wherein the layer of transition metal atoms comprises at least one of: Molybdenum (Mo), Tungsten (W), Tin (Sn), Hafnium (Hf), Zirconium (Zr), Platinum (Pt), or any combination thereof.

Clause 28. The method of any of clauses 26 to 27, wherein the layers of chalcogen atoms comprise at least one of: Sulphur (S), Selenium (Se), Tellurium (Te), or any combination thereof.

Clause 29. The method of any of clauses 23 to 28, further comprising: depositing a back gate WFM on the first back gate and on the second back gate, wherein the back gate WFM is located between the first dielectric layer and the first back gate and the second back gate.

Clause 30. The method of any of clauses 23 to 29, wherein the double gate MOS transistor is a P-type MOS transistor or an N-type MOS transistor.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. An apparatus comprising a double gate metal oxide semiconductor (MOS) transistor, wherein the double gate MOS transistor comprises:
   a first back gate;
   a second back gate;
   a first dielectric layer disposed on the first back gate and on the second back gate;
   an MX2 material layer disposed on the first dielectric layer;
   a second dielectric layer disposed on the MX2 material layer;
   a work function metal (WFM) disposed on the second dielectric layer;
   a front gate disposed on the WFM, wherein the front gate fills a space between the first back gate and the second back gate;
   an upper dielectric layer, wherein at least a portion of the double gate MOS transistor is in the upper dielectric layer;
   a shallow trench isolation layer located below the upper dielectric layer; and
   a silicon substrate located below the shallow trench isolation layer,
   wherein the first back gate comprises a first fin that comprises N+ doped Silicon, wherein the first back gate is coupled to a P-well disposed in the silicon substrate, wherein the second back gate comprises a second fin that comprises N+ doped Silicon, and wherein the second back gate is coupled to the P-well disposed in the silicon substrate.

2. The apparatus of claim 1, wherein the first back gate, the second back gate, and the front gate each comprises Tungsten (W), Titanium (Ti), Titanium Nitride (TiN), Tantalum (Ta), Tantalum Nitride (TaN), or polysilicon.

3. The apparatus of claim 1, wherein the first dielectric layer and the second dielectric layer comprise Hafnium Oxide (HfOx).

4. The apparatus of claim 1, wherein the MX2 material layer disposed over the first back gate is separated from the MX2 material layer disposed over the second back gate, and the second dielectric layer disposed over the first back gate is separated from the second dielectric layer disposed over the second back gate.

5. The apparatus of claim 1, wherein the MX2 material layer comprises a layer of transition metal atoms between two layers of chalcogen atoms.

6. The apparatus of claim 5, wherein the layer of transition metal atoms comprises at least one of: Molybdenum (Mo), Tungsten (W), Tin (Sn), Hafnium (Hf), Zirconium (Zr), Platinum (Pt), or any combination thereof.

7. The apparatus of claim 5, wherein the layers of chalcogen atoms comprise at least one of: Sulphur (S), Selenium (Se), Tellurium (Te), or any combination thereof.

8. The apparatus of claim 1, wherein the WFM is an N-type WFM.

9. The apparatus of claim 1, wherein the double gate MOS transistor is an N-type MOS (N-MOS) transistor or a P type MOS (P MOS) transistor.

10. The apparatus of claim 1, further comprising:
    an optical waveguide located in the silicon substrate.

11. The apparatus of claim 1, further comprising a second double gate MOS transistor, wherein the second double gate MOS transistor comprises:
    a first back gate;
    a second back gate;
    a first dielectric layer disposed on the first back gate and on the second back gate;
    an MX2 material layer disposed on the first dielectric layer;
    a second dielectric layer disposed on the MX2 material layer;
    a work function metal (WFM) disposed on the second dielectric layer; and
    a front gate disposed on the WFM, wherein the front gate fills a space between the first back gate and the second back gate.

12. The apparatus of claim 11, wherein the second double gate MOS transistor is a P-type MOS transistor.

13. An apparatus comprising a double gate metal oxide semiconductor (MOS) transistor, wherein the double gate MOS transistor comprises:
    a first back gate;
    a second back gate;
    a first dielectric layer disposed on the first back gate and on the second back gate;
    an MX2 material layer disposed on the first dielectric layer;
    a second dielectric layer disposed on the MX2 material layer;
    a work function metal (WFM) disposed on the second dielectric layer;
    a front gate disposed on the WFM, wherein the front gate fills a space between the first back gate and the second back gate;
    an upper dielectric layer, wherein at least a portion of the double gate MOS transistor is in the upper dielectric layer;
    a shallow trench isolation layer located below the upper dielectric layer; and
    a silicon substrate located below the shallow trench isolation layer, wherein the first back gate comprises a first fin that comprises P+ doped Silicon, wherein the first back gate is coupled to an N-well disposed in the silicon substrate, wherein the second back gate comprises a second fin that comprises P+ doped Silicon, and wherein the second back gate is coupled to the N-well disposed in the silicon substrate.

14. A method for fabricating a double gate metal oxide semiconductor (MOS) transistor, comprising:
  forming a first back gate;
  forming a second back gate;
  depositing a first dielectric layer on the first back gate and on the second back gate;
  depositing an MX2 material layer on the first dielectric layer;
  depositing a second dielectric layer on the MX2 material layer;
  depositing a work function metal (WFM) on the second dielectric layer;
  forming a front gate on the WFM, wherein the front gate fills a space between the first back gate and the second back gate;
  depositing an upper dielectric layer, wherein at least a portion of the double gate MOS transistor is in the upper dielectric layer; and
  forming a shallow trench isolation layer located below the upper dielectric layer,
  wherein a silicon substrate locates below the shallow trench isolation layer, wherein the first back gate comprises a first fin that comprises N+ doped Silicon, wherein the first back gate is coupled to a P-well disposed in the silicon substrate, wherein the second back gate comprises a second fin that comprises N+ doped Silicon, and wherein the second back gate is coupled to the P-well disposed in the silicon substrate.

15. The method of claim 14, wherein the MX2 material layer disposed over the first back gate is separated from the MX2 material layer disposed over the second back gate, and the second dielectric layer disposed over the first back gate is separated from the second dielectric layer disposed over the second back gate.

16. The method of claim 14, wherein the MX2 material layer comprises a layer of transition metal atoms between two layers of chalcogen atoms.

17. The method of claim 16, wherein the layer of transition metal atoms comprises at least one of: Molybdenum (Mo), Tungsten (W), Tin (Sn), Hafnium (Hf), Zirconium (Zr), Platinum (Pt), or any combination thereof.

18. The method of claim 16, wherein the layers of chalcogen atoms comprise at least one of: Sulphur (S), Selenium (Se), Tellurium (Te), or any combination thereof.

19. The method of claim 14, wherein the double gate MOS transistor is an N-type MOS transistor.

20. A method for fabricating a double gate metal oxide semiconductor (MOS) transistor, comprising:
  forming a first back gate;
  forming a second back gate;
  depositing a first dielectric layer on the first back gate and on the second back gate;
  depositing an MX2 material layer on the first dielectric layer;
  depositing a second dielectric layer on the MX2 material layer;
  depositing a work function metal (WFM) on the second dielectric layer;
  forming a front gate on the WFM, wherein the front gate fills a space between the first back gate and the second back gate;
  depositing an upper dielectric layer, wherein at least a portion of the double gate MOS transistor is in the upper dielectric layer; and
  forming a shallow trench isolation layer located below the upper dielectric layer,
  wherein a silicon substrate locates below the shallow trench isolation layer, wherein the first back gate comprises a first fin that comprises P+ doped Silicon, wherein the first back gate is coupled to an N-well disposed in the silicon substrate, wherein the second back gate comprises a second fin that comprises P+ doped Silicon, and wherein the second back gate is coupled to the N-well disposed in the silicon substrate.

* * * * *